United States Patent
Park et al.

(10) Patent No.: US 10,948,789 B2
(45) Date of Patent: Mar. 16, 2021

(54) DISPLAY APPARATUS COMPRISING A BRIDGE PORTION FORMED OF A SAME MATERIAL AS A SECOND COLOR FILTER AND CONNECTING ADJACENT SECOND COLOR FILTERS OF ADJACENT PIXEL AREAS

(71) Applicant: Samsung Display Co., Ltd., Yongin-si (KR)

(72) Inventors: Minwook Park, Hwaseong-si (KR); Jiwon Sohn, Seoul (KR); Hun-Tae Kim, Hwaseong-si (KR); Kyung-Ho Park, Asan-si (KR); Yunseok Lee, Seoul (KR); Jinsu Lee, Suwon-si (KR)

(73) Assignee: Samsung Display Co., Ltd.

( * ) Notice: Subject to any disclaimer, the term of this patent is extended or adjusted under 35 U.S.C. 154(b) by 509 days.

(21) Appl. No.: 15/868,504

(22) Filed: Jan. 11, 2018

(65) Prior Publication Data
US 2018/0275471 A1    Sep. 27, 2018

(30) Foreign Application Priority Data
Mar. 21, 2017   (KR) .................. 10-2017-0035570

(51) Int. Cl.
*G02F 1/1362* (2006.01)
*G02F 1/1339* (2006.01)
(Continued)

(52) U.S. Cl.
CPC ...... *G02F 1/136209* (2013.01); *G02F 1/1368* (2013.01); *G02F 1/13394* (2013.01);
(Continued)

(58) Field of Classification Search
CPC .......... G02F 2202/10; G02F 2202/103; G02F 2001/13396; G02F 2001/136218; G02F 2001/136222; G02F 2001/13356
See application file for complete search history.

(56) References Cited

U.S. PATENT DOCUMENTS 8,810,755 B2    8/2014 Joo et al.
9,207,375 B2   12/2015 Joo et al.
(Continued)

FOREIGN PATENT DOCUMENTS

| KR | 10-1229288     | 12/2007 |
| KR | 10-2013-0006560 | 1/2013  |
| KR | 10-2016-0130045 | 11/2016 |

OTHER PUBLICATIONS

Extended European Search Report, Application No. 18162916.3, dated Jul. 24, 2018, 9 pages.

*Primary Examiner* — Paul C Lee
(74) *Attorney, Agent, or Firm* — Innovation Counsel LLP

(57) ABSTRACT

A display apparatus includes pixel areas and a light blocking area between the pixel areas. The display apparatus includes a first base substrate, a thin film transistor, and first, second, and third color filters. The first color filter has a first color, the second color filter has a second color different from the first color, and the third color filter has a third color different from the first and second colors. In the light blocking area, the thin film transistor, the first color filter, and the third color filter at least partially overlap each other. The second color filter in at least one pixel area is connected to an adjacent second color filter disposed in an adjacent pixel area by a bridge portion, and the bridge portion is formed of the same material as the second color filter and is disposed in the light blocking area.

16 Claims, 49 Drawing Sheets

(51) Int. Cl.
   *G02F 1/1368* (2006.01)
   *H01L 27/12* (2006.01)
(52) U.S. Cl.
   CPC .. *G02F 1/136227* (2013.01); *G02F 1/136286* (2013.01); *G02F 2001/13396* (2013.01); *G02F 2001/136218* (2013.01); *G02F 2001/136222* (2013.01); *G02F 2001/136295* (2013.01); *H01L 27/124* (2013.01)

(56) References Cited

U.S. PATENT DOCUMENTS

| | | |
|---|---|---|
| 2012/0088325 A1 | 4/2012 | Fujiyoshi et al. |
| 2015/0138480 A1 | 5/2015 | Yi et al. |
| 2015/0355500 A1* | 12/2015 | Kwon ................. H01L 27/1259 349/43 |
| 2016/0116794 A1* | 4/2016 | Song ................. H01L 27/1259 349/43 |
| 2016/0202545 A1* | 7/2016 | Lee ................... G02F 1/134309 257/72 |
| 2016/0274428 A1* | 9/2016 | Kim ..................... H01L 27/124 |
| 2016/0320662 A1 | 11/2016 | Hwahg et al. |
| 2017/0059952 A1 | 3/2017 | Itou et al. |

* cited by examiner

DISPLAY APPARATUS COMPRISING A BRIDGE PORTION FORMED OF A SAME MATERIAL AS A SECOND COLOR FILTER AND CONNECTING ADJACENT SECOND COLOR FILTERS OF ADJACENT PIXEL AREAS

The present application claims priority to and the benefit of Korean Patent Application No. 10-2017-0035570, filed on Mar. 21, 2017, the disclosure of which is incorporated by reference herein in its entirety.

BACKGROUND

1. Field

Example embodiments of the inventive concept relate to a display apparatus and a method of manufacturing the display apparatus. More particularly, example embodiments of the inventive concept relate to a display apparatus including a lower substrate including a color filter and a method of manufacturing the display apparatus.

2. Description of the Related Art

Recently, a display apparatus having light weight and small size has been manufactured. A cathode ray tube (CRT) display apparatus has been used due to a performance and a competitive price. However the CRT display apparatus has a weakness with a size or portability. Therefore a display apparatus such as a plasma display apparatus, a liquid crystal display apparatus and an organic light emitting display apparatus has been highly regarded due to small size, light weight and low-power-consumption.

The liquid crystal display apparatus applies a voltage to specific molecular arrangement configured to change the molecular arrangement. The liquid crystal display apparatus displays an image using changes of optical property (for example, birefringence, rotatory polarization, dichroism and light scattering) of a liquid crystal cell according to the changes of the molecular arrangement.

The display apparatus includes a color filter disposed in a pixel area in which an image is displayed, a black matrix disposed in a light blocking area where no image is displayed, and a column spacer for maintaining cell gap between a lower substrate and an upper substrate. However, in order to form the black matrix, an additional mask is required, there are problems that the structure of the display apparatus is complicated and the manufacturing cost is increased. In addition, the column spacer may include a main column spacer which is always in contact with the upper substrate and a sub-column spacer formed at a lower height than the main column spacer. Since the sub-column spacer is formed using a halftone mask or the like, it has been difficult to form the sub-column spacer at a proper position at a uniform height. Accordingly, it is difficult to maintain the cell gap of the display apparatus.

SUMMARY

One or more example embodiment of the inventive concept provides a display apparatus having a simple structure, capable of implement a light blocking area without an additional light blocking member such as a black matrix, and capable of maintaining a cell-gap which is a gap between a lower substrate and an upper substrate.

One or more example embodiments of the inventive concept also provide a method of manufacturing the display apparatus.

According to an example embodiment of the inventive concept, a display apparatus includes a plurality of pixel areas and a light blocking area between the pixel areas. The display apparatus includes a first base substrate, a thin film transistor disposed on the first base substrate corresponding to each of the pixel areas, a first color filter having a first color and disposed on the first base substrate, a second color filter having a second color different from the first color, and disposed on the first base substrate, and a third color filter having a third color different from the first and second colors, and disposed on the first base substrate. In the light blocking area, the thin film transistor, the first color filter, and the third color filter at least partially overlap each other. The second color filter in at least one pixel area is connected to an adjacent second color filter disposed is an adjacent pixel area by a bridge portion, and the bridge portion is formed of the same material as the second color filter and is disposed in the light blocking area.

In an example embodiment, the first color may be red, the second color may be green, and the third color may be blue.

In an example embodiment, the first color filter may extend in a first direction across a plurality of pixel areas. The second color filter may extend in the first direction across a plurality of pixel areas. The third color filter may extend in the first direction across a plurality of pixel areas, so that each of the first, second, and third color filters may be arranged in a strip shape.

In an example embodiment, the bridge portion may not overlap with the thin film transistor.

In an example embodiment, the display apparatus may further include a fourth color filter disposed on the first base substrate, the fourth color filter may be transparent. The first, second, and third color filters may overlap with the fourth color filter.

In an example embodiment, the display apparatus may further include an organic insulation layer disposed on the first, second, and third color filters, and including an organic insulation material.

In an example embodiment, the display apparatus may further include a shielding electrode disposed on the organic insulation layer in the light blocking area.

In an example embodiment, the display apparatus may further include a pixel electrode electrically connected to the thin film transistor and formed from a same layer as the shielding electrode. The pixel electrode may be electrically connected through a contact hole extending through the first color filter, the third color filter, and the organic insulation layer.

In an example embodiment, the display apparatus may further include a floating electrode disposed on the first base substrate. The pixel electrode may include a stem extending in a first direction or a third direction. A plurality of slits may extend from the stem to an edge of the pixel electrode.

In an example embodiment, the display apparatus may further include a second base substrate facing the first base substrate, a liquid crystal layer between the first base substrate and the second base substrate, and a main column spacer overlapping the first, second, and third color filters. The main column spacer may be for maintaining a cell gap of the liquid crystal layer.

In an example embodiment, the bridge portion of the second color filter may overlap the first color filter, the third color filter, or the first and third color filters. A second sub-column spacer which may be smaller than the main column spacer is formed by the bridge portion for maintaining a pressing gap of the liquid crystal layer.

In an example embodiment, the display apparatus may further include a first sub-column spacer which is smaller than the main column spacer for maintaining the pressing gap.

In an example embodiment, the display apparatus may further include a shielding electrode disposed in the light blocking area and including a transparent conductive material. The shielding electrode may be a mesh structure along the light blocking area. The second color filter may be cut off at a portion where the bridge portion is disposed, so that the bridge portion may not overlap with the shielding electrode.

In an example embodiment, the first color may be red, and the first color filter may be cut off at a portion where the bridge portion is disposed. The bridge portion may entirely overlap with the third color filter in the light blocking area, and the bridge portion may not entirely overlap with the first color filter.

In an example embodiment, the third color may be blue. The third color filter may be cut off at a portion where the bridge portion may be disposed. The bridge portion may entirely overlap with the first color filter in the light blocking area, and the bridge portion may not entirely overlap with the third color filter.

According to an example embodiment of the inventive concept, a display apparatus includes first, second, third, fourth, fifth, and sixth pixel areas which are arranged in a 3*2 matrix form in a second direction and in a first direction, and a light blocking area between the first, second, third, fourth, fifth, and sixth pixel areas. The display apparatus includes a first color filter disposed in the first pixel area, and the second pixel area which is adjacent to the first pixel area in the first direction, a second color filter disposed in the third pixel area adjacent to the first pixel area in the second direction, and the fourth pixel area adjacent to the third pixel area in the first direction, and a third color filter disposed in the fifth pixel area adjacent to the third pixel area in the second direction, and the sixth pixel area adjacent to the fifth pixel area in the first direction. The third color filter overlaps with the first color filter in the light blocking area. The second color filter includes a bridge portion in the light blocking area between the third pixel area and the forth pixel area.

In an example embodiment, the first color filter may be a red color filter, the second color filter may be a green color filter, and the third color filter may be a blue color filter.

In an example embodiment, the display apparatus may further include a fourth color filter disposed in a seventh pixel area and an eighth pixel area adjacent to the seventh pixel area in the first direction. The fourth color filter may be a transparent color filter, and be disposed in the entirety of the first, second, third, fourth, fifth, sixth, seventh, and eighth pixel areas.

In an example embodiment, the display apparatus may further include a liquid crystal layer dispose in the first, second, third, fourth, fifth, and sixth pixel area, and a main column spacer for maintaining a cell gap of the liquid crystal layer. The bridge portion of the second color filter may overlap the first color filter, the third color filter, or the first and third color filters. A second sub-column spacer which is smaller than the main column spacer may be formed by the bridge portion for maintaining a pressing gap of the liquid crystal layer.

In an example embodiment, the display apparatus may further include a shielding electrode disposed in the light blocking area and including a transparent conductive material.

According to an example embodiment of the inventive concept, a display apparatus includes a plurality of pixel areas and a light blocking area between the pixel areas. The display apparatus further includes a first base substrate, a thin film transistor disposed on the first base substrate corresponding to each of the pixel area, a first color filter having a first color and disposed on the first base substrate, a second color filter having a second color different from the first color, and disposed on the first base substrate, and a third color filter having a third color different from the first and second color, and disposed on the first base substrate. In the light blocking area, the thin film transistor, the first color filter, and the third color filter at least partially overlap each other. The second color filter may be connected to an adjacent second color filter by a bridge portion, and the bridge portion and the second color filter include the same material.

According to the present example embodiment, the light blocking function can be improved by overlapping of the first and third color filters, a first floating electrode, a gate pattern, a data pattern and a shielding electrode in the light blocking area of the display apparatus. Further, the shielding function can be improved by a gate line and the shielding electrode of the light blocking area. Accordingly, the display apparatus can implement the light blocking area without an additional black matrix structure.

In addition, since a second sub-column spacer is formed by the bridge portion of the display apparatus, the pressing gap of the display apparatus can be effectively maintained.

It is to be understood that both the foregoing general description and the following detailed description are exemplary and explanatory and are intended to provide further explanation of the inventive concept as claimed

BRIEF DESCRIPTION OF THE DRAWINGS

The above and other features of the inventive concept will become more apparent by describing in detail example embodiments thereof with reference to the accompanying drawings, in which.

DETAILED DESCRIPTION

Hereinafter, the inventive concept will be explained in detail with reference to the accompanying drawings.

Figure 1:
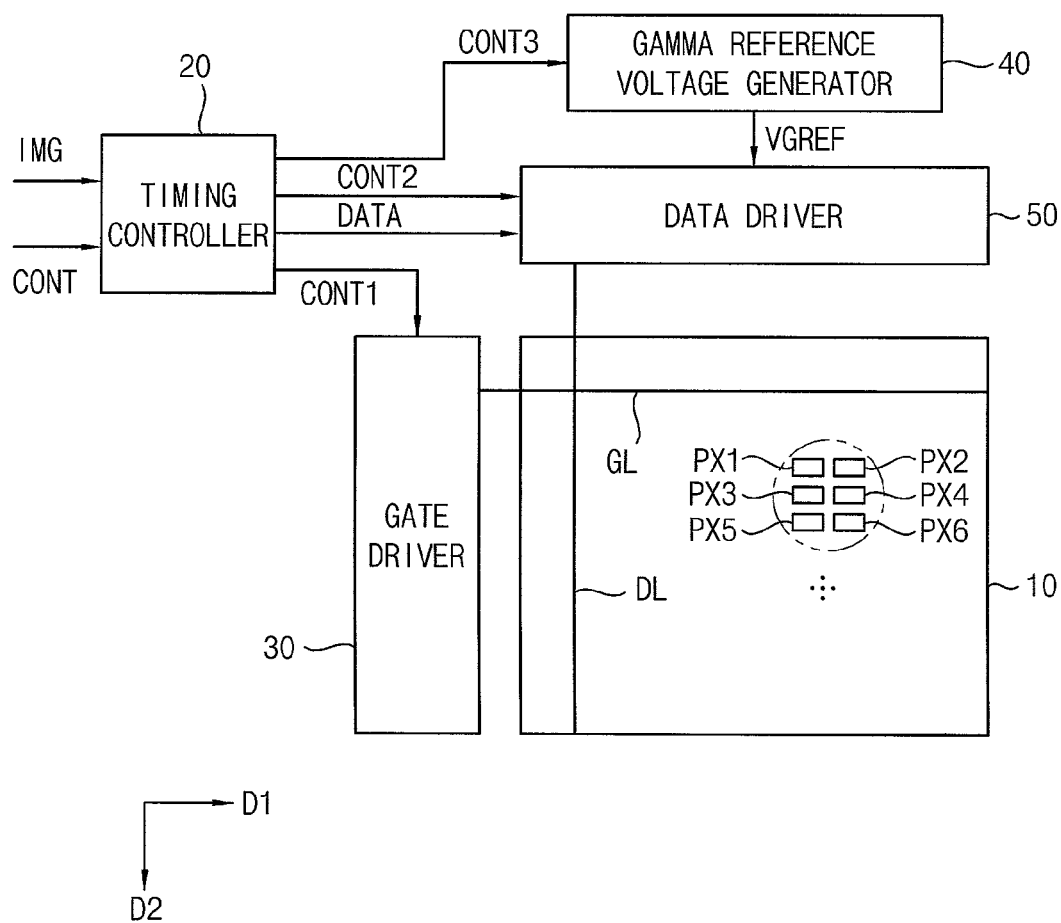
FIG. 1 is a block diagram illustrating a display apparatus according to an example embodiment of the inventive concept.

FIG. 1 is a block diagram illustrating a display apparatus according to an example embodiment of the inventive concept.

Referring to FIG. 1, the display apparatus may include a display panel 10 and a display panel driver. The display panel driver may include a timing controller 20, a gate driver 30, a gamma reference voltage generator 40 and a data driver 50.

The display panel 10 may include a plurality of gate lines GL, a plurality of data lines DL and a plurality of pixels electrically connected to the gate lines GL and the data lines DL. The gate lines GL may extend in a first direction D1 and the data lines DL may extend in a second direction D2 crossing the first direction D1.

Each pixel may include a switching element, a liquid crystal capacitor and a storage capacitor. The liquid crystal capacitor and the storage capacitor are electrically connected to the switching element. The pixels may be disposed in a matrix form.

The display panel 10 may include a first substrate, a second substrate facing the first substrate and a liquid crystal layer disposed between the first substrate and the second substrate. The gate lines, the data lines, pixel electrodes of the pixels and the switching elements may be formed on the first substrate. A common electrode may be formed on the second substrate.

The structure of the display panel 10 may be explained referring to FIGS. 2, 3A, 3B, 3C, 4A, 4B, 5A, 5B and 5C in detail.

The timing controller 20 may receive input image data IMG and an input control signal CONT from an external apparatus (not shown). The input image data IMG may include red image data, green image data and blue image data. The input control signal CONT may include a master clock signal and a data enable signal. The input control signal CONT may further include a vertical synchronizing signal and a horizontal synchronizing signal.

The timing controller 20 may generate a first control signal CONT1, a second control signal CONT2, a third control signal CONT3 and a data signal DATA based on the input image data IMG and the input control signal CONT.

The timing controller 20 may generate the first control signal CONT1 for controlling an operation of the gate driver 30 based on the input control signal CONT, and outputs the first control signal CONT1 to the gate driver 30. The first control signal CONT1 may further include a vertical start signal and a gate clock signal.

The timing controller 20 may generate the second control signal CONT2 for controlling an operation of the data driver 50 based on the input control signal CONT, and outputs the second control signal CONT2 to the data driver 50. The second control signal CONT2 may include a horizontal start signal and a load signal.

The timing controller 20 may generate the data signal DATA based on the input image data IMG. The timing controller 20 may output the data signal DATA to the data driver 50.

The timing controller 20 may generate the third control signal CONT3 for controlling an operation of the gamma reference voltage generator 40 based on the input control signal CONT, and output the third control signal CONT3 to the gamma reference voltage generator 40.

The gate driver 30 may generate gate signals driving the gate lines GL in response to the first control signal CONT1 received from the timing controller 20. The gate driver 30 may sequentially output the gate signals to the gate lines GL.

The gamma reference voltage generator 40 may generate a gamma reference voltage VGREF in response to the third control signal CONT3 received from the timing controller 20.

The gamma reference voltage generator 40 may provide the gamma reference voltage VGREF to the data driver 50. The gamma reference voltage VGREF may have a value corresponding to a level of the data signal DATA.

In an exemplary embodiment, the gamma reference voltage generator 40 may be disposed in the timing controller 20, or in the data driver 50.

The data driver 50 may receive the second control signal CONT2 and the data signal DATA from the timing controller 20, and receive the gamma reference voltages VGREF from the gamma reference voltage generator 40. The data driver 50 may convert the data signal DATA into data voltages having an analog type using the gamma reference voltages VGREF. The data driver 50 may output the data voltages to the data lines DL. Accordingly, the display apparatus may display an image by emitting light from a plurality of pixel areas (PX1 to PX6) which are corresponding to the pixels mentioned above, respectively.

Figure 2:
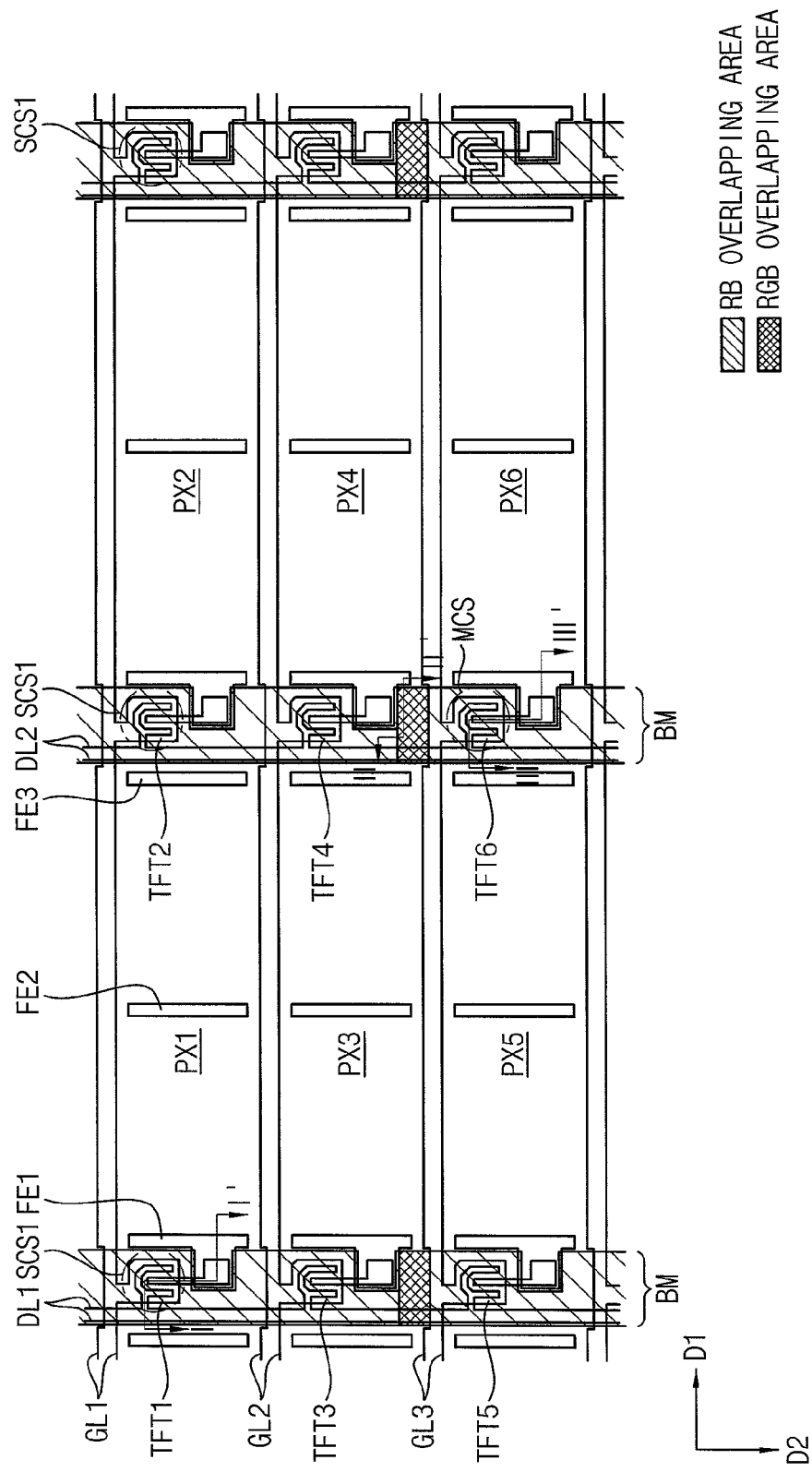
FIG. 2 is a plan view illustrating first to sixth pixel areas of the display apparatus of FIG. 1 in detail.
Figure 3A:
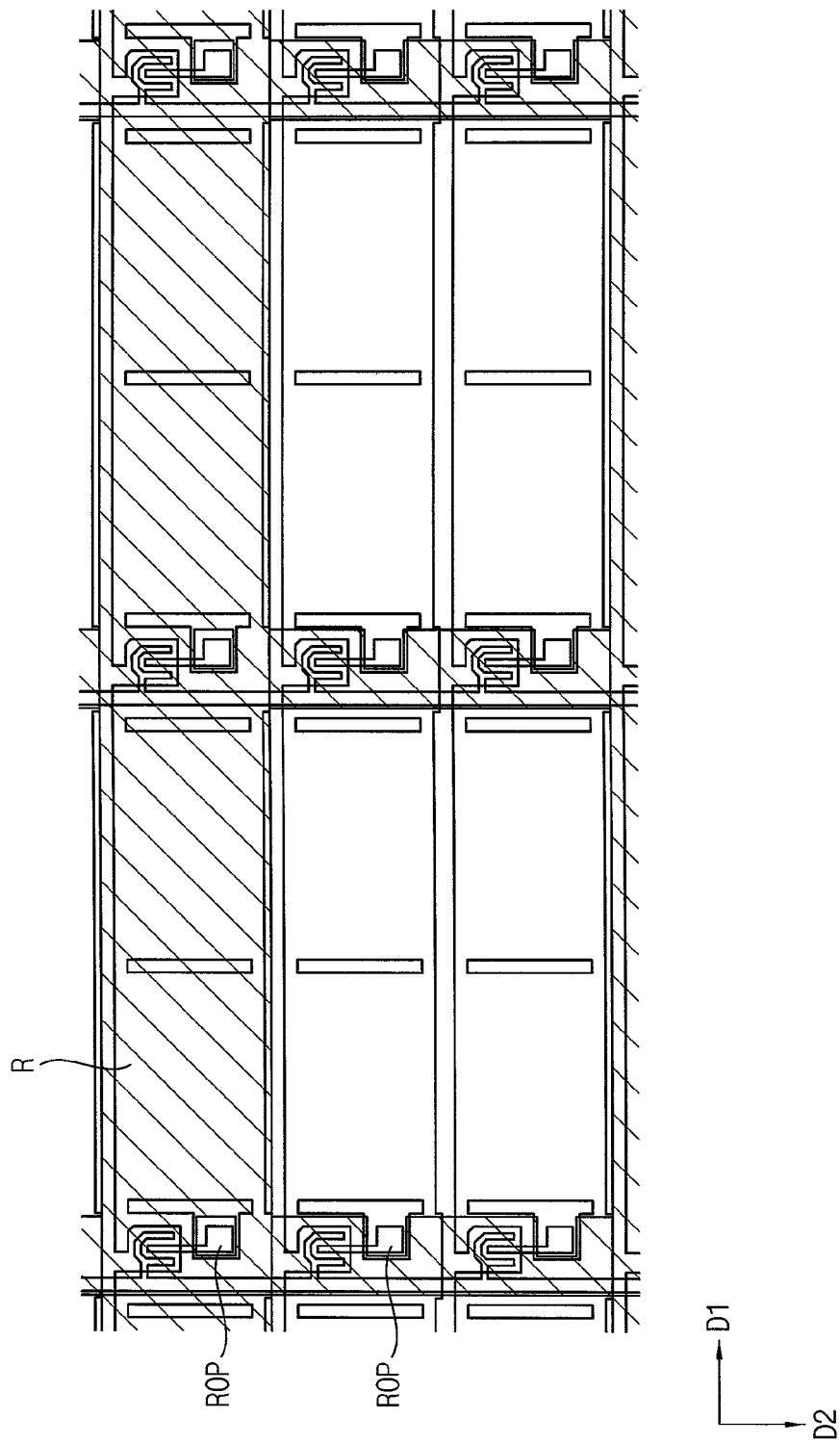
FIGS. 3A, 3B and 3C are plan views illustrating a first color filter, a second color filter, and a third color filter of the display apparatus of FIG. 2, respectively.
Figure 3B:
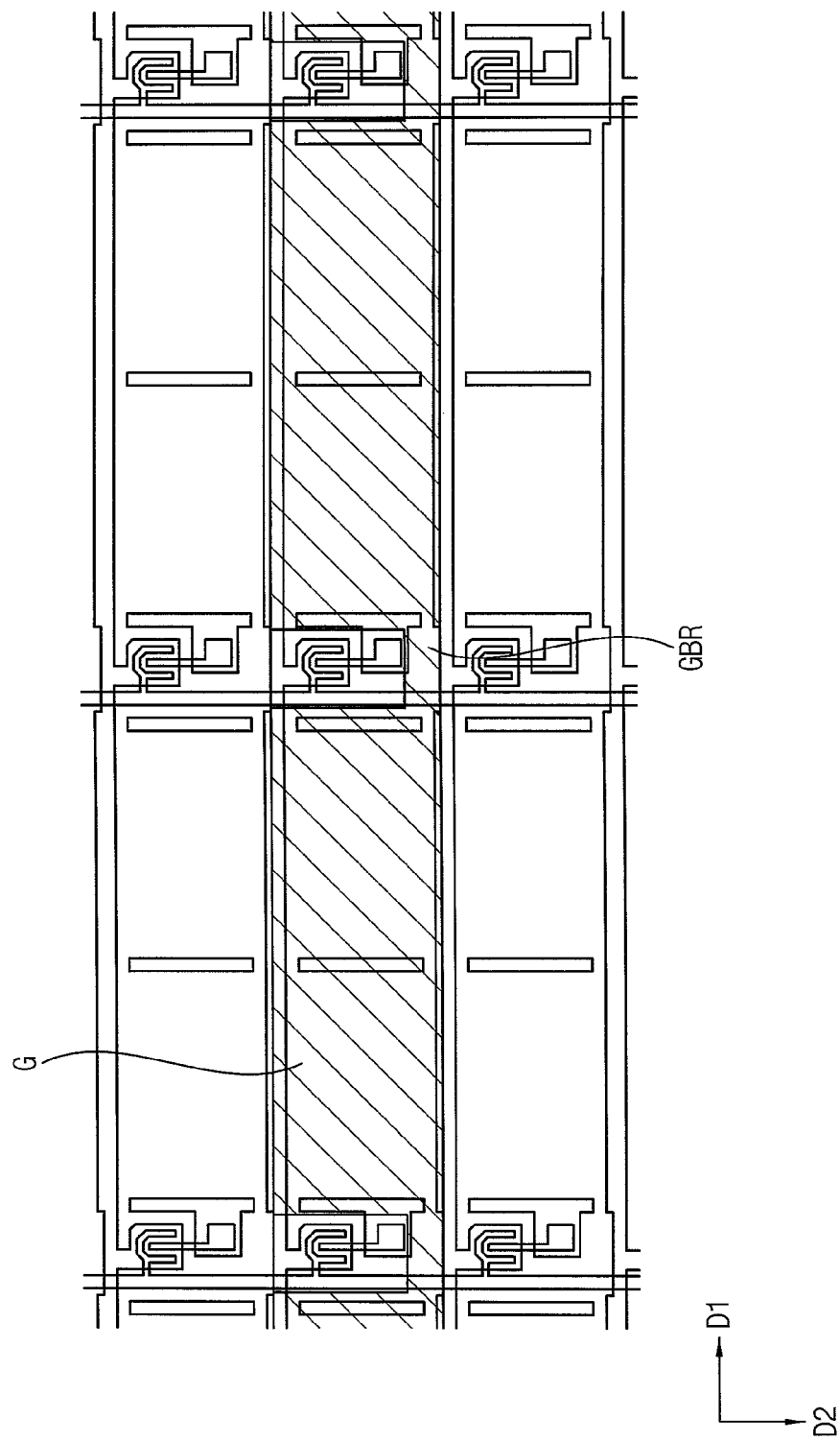
Figure 3C:
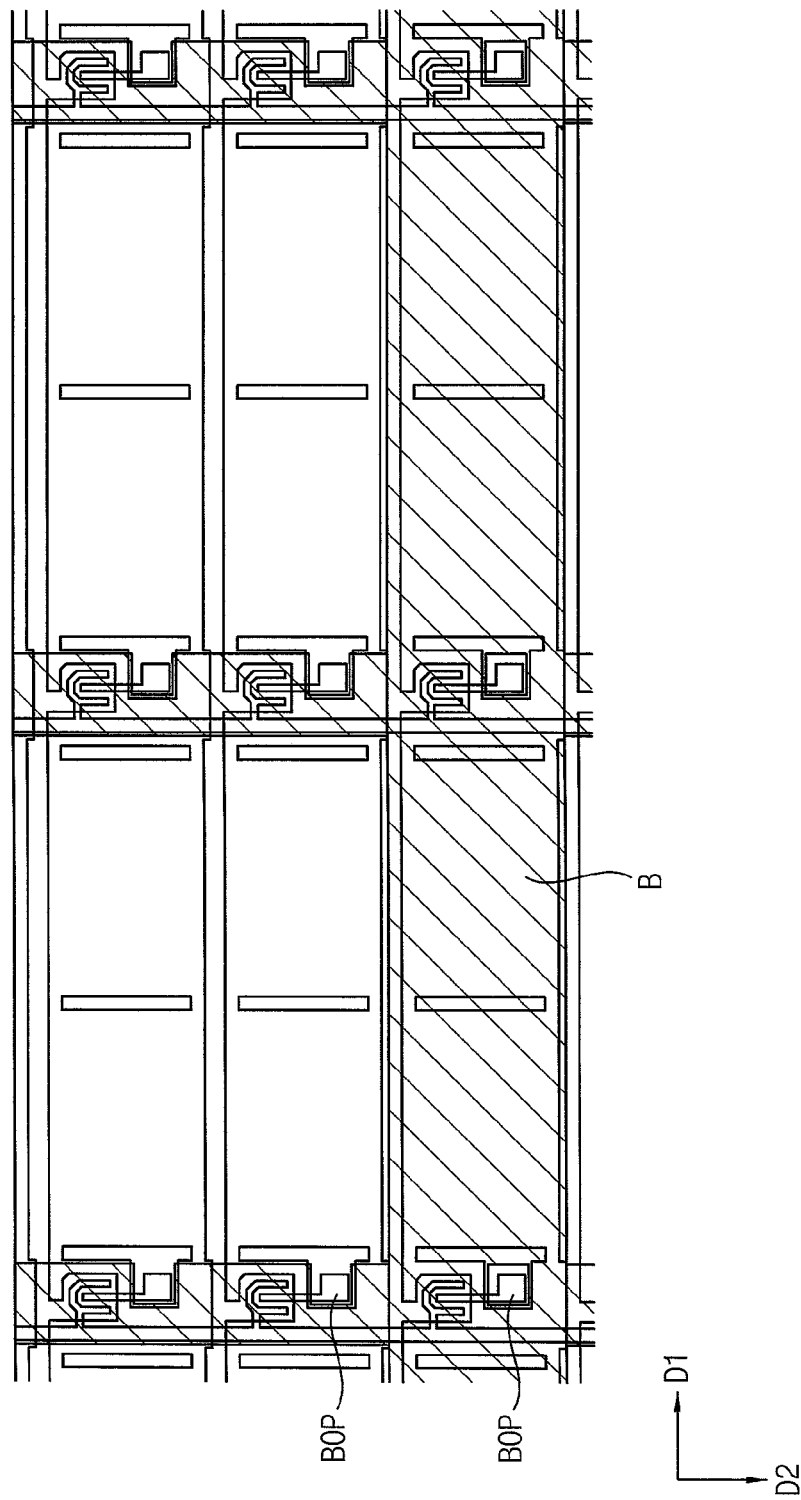
Figure 4A:
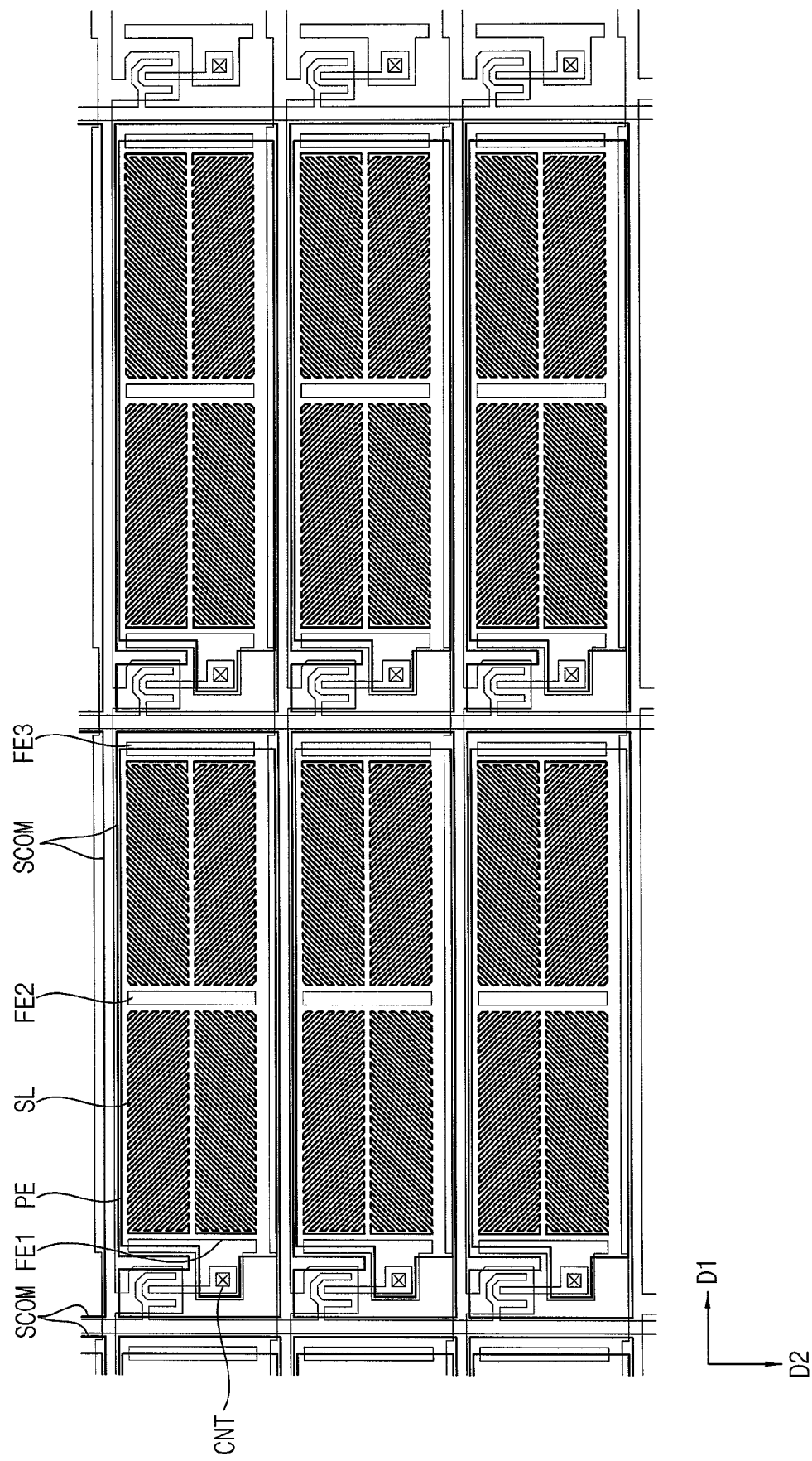
FIG. 4A is a plan view illustrating a shielding electrode and a pixel electrode of the display apparatus of FIG. 2.
Figure 4B:
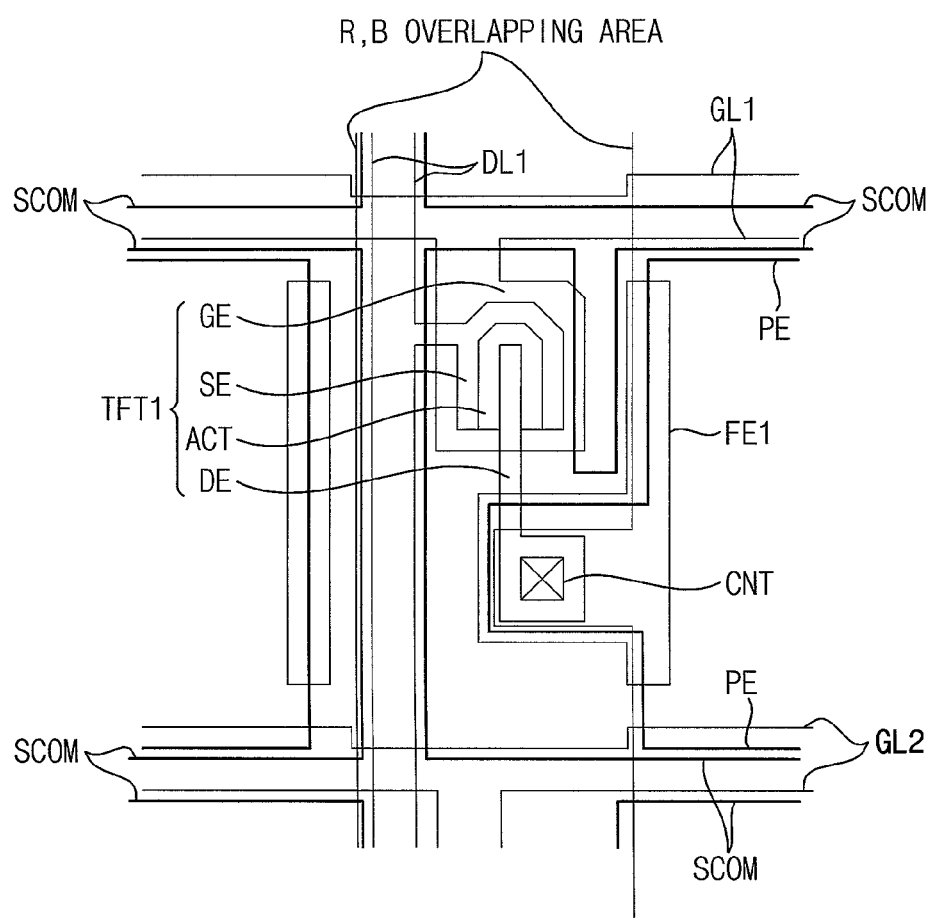
FIG. 4B is an enlarged plan view of a vicinity of a first thin film transistor of the display apparatus of FIG. 2.
Figure 5A:
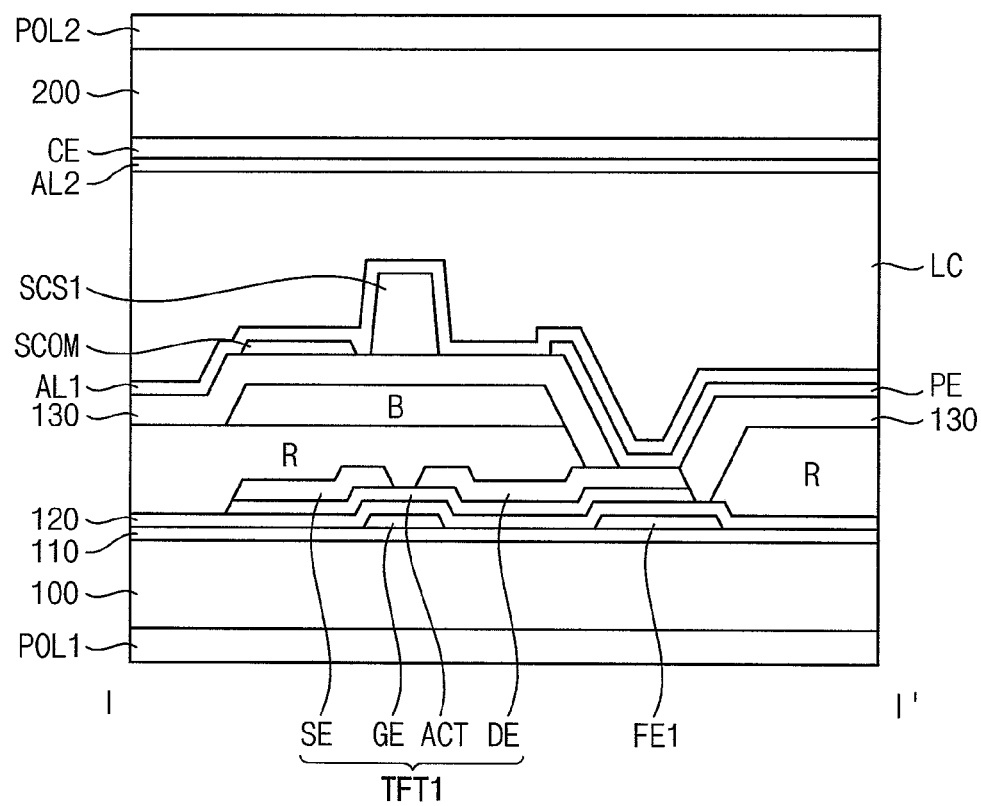
FIGS. 5A, 5B and 5C are cross-sectional views taken along line I-I', II-II' and III-III' of the display apparatus of FIG. 2, respectively.
Figure 5B:
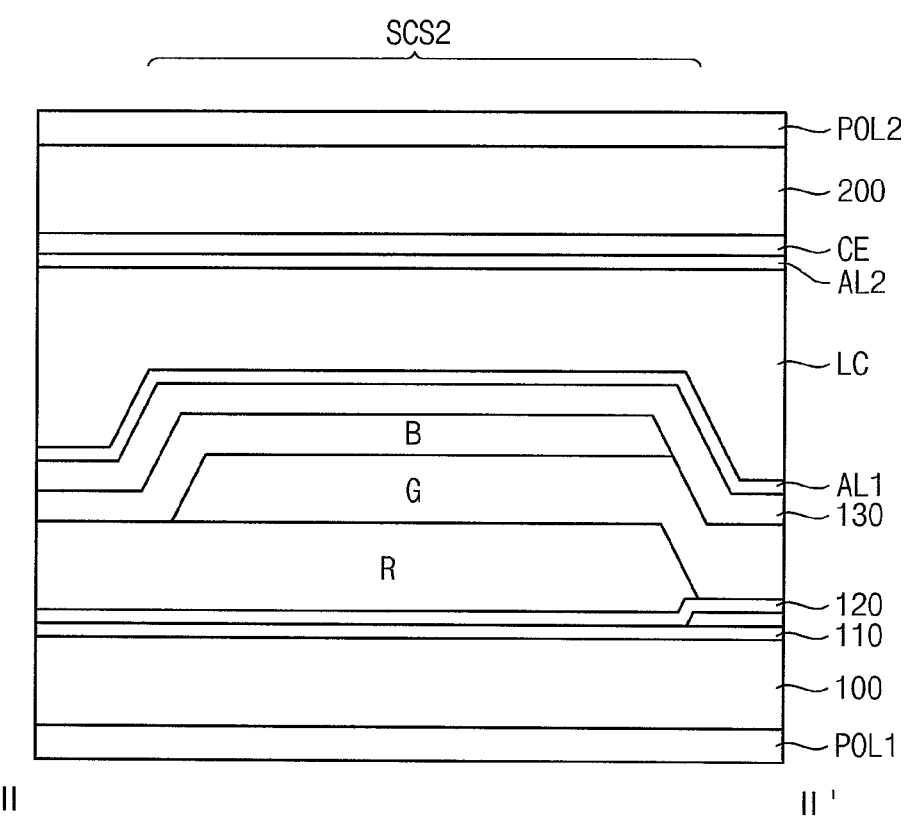
Figure 5C:
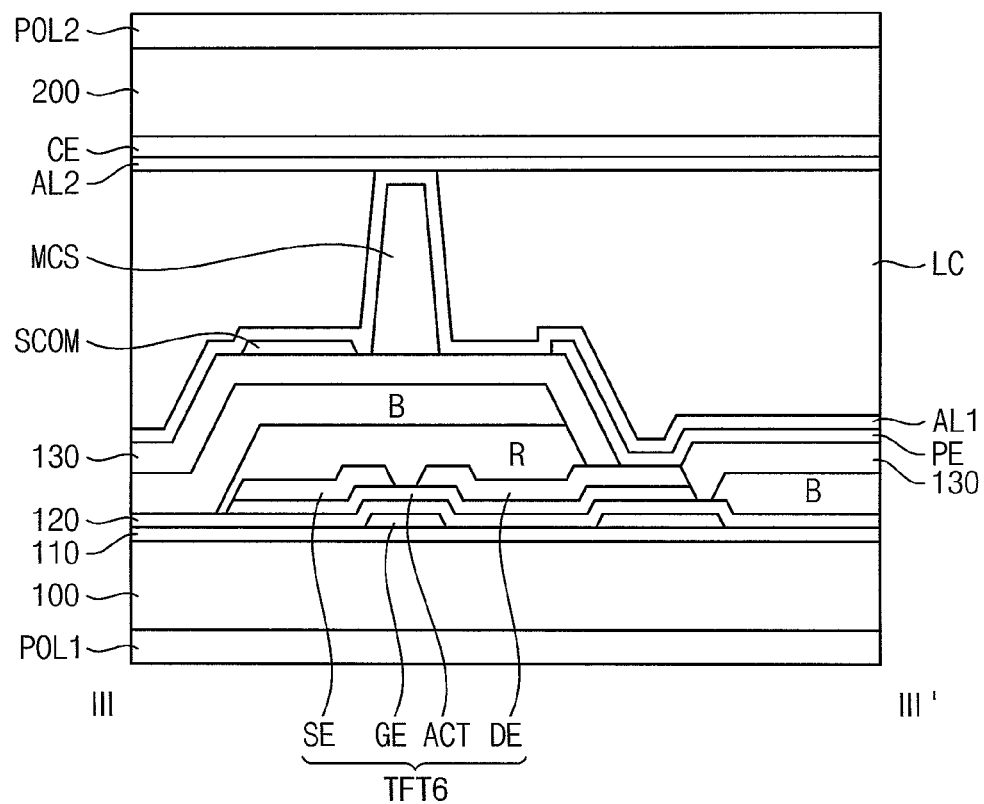

FIG. 2 is a plan view illustrating first to sixth pixel areas PX1 to PX6 of the display apparatus of FIG. 1 in detail. FIGS. 3A, 3B and 3C are plan views illustrating a first color filter R, a second color filter G, and a third color filter B of the display apparatus of FIG. 2, respectively. FIG. 4A is a plan view illustrating a shielding electrode SCOM and a pixel electrode PE of the display apparatus of FIG. 2. FIG. 4B is an enlarged plan view of a vicinity of a first thin film transistor TFT1 of the display apparatus of FIG. 2. FIGS. 5A, 5B and 5C are cross-sectional views taken along line I-I', II-II' and III-III' of the display apparatus of FIG. 2, respectively.

Referring to FIGS. 2, 3A, 3B, 3C, 4A, 4B, 5A, 5B and 5C, the display apparatus may include a first pixel area PX1, a second pixel area PX2, a third pixel area PX3, a fourth pixel area PX4, a fifth pixel area PX5, a sixth pixel area PX6, sometimes collectively referred to as the first to sixth pixel areas PX1 to PX6, and a light blocking area BM between the first to sixth pixel areas PX1 to PX6. The first to sixth pixel areas PX1 to PX6 may be arranged in a 3*2 matrix form in the second direction D2 and the first direction D1. The second direction D2 may be substantially perpendicular to the first direction D1. The first to sixth pixel areas PX1 through PX6 are regions in which light is emitted for the display apparatus to display an image, and the light blocking area BM are regions in which no light is emitted.

Although only a pixel structure of six pixel areas is shown in the drawing, the display apparatus may have a structure in which the pixel structure is repeatedly formed.

The display apparatus may include a lower substrate, an upper substrate opposite to the lower substrate, and a liquid crystal layer LC between the lower substrate and the upper substrate.

The lower substrate may include a first polarizer POL1, a first base substrate 100, a buffer layer 110, a gate pattern, an active pattern ACT, a data pattern, a first insulation layer 120, the first color filter R, the third color filter B, an organic insulation layer 130, a transparent electrode pattern, a main column spacer MCS, a first sub-column spacer SCS1, and a first alignment layer AL1.

The first polarizer POL1 may be attached on the first base substrate 100. The first polarizer POL1 may be disposed between a backlight unit (not shown) for providing light to the liquid crystal layer LC and the first base substrate 100. The first polarizer POL1 may polarize transmitted light, and a commonly used polyvinyl alcohol (PVA) polarizer can be used for the first polarizer POL1. Although not shown in figures, in some example embodiment, the first polarizer POL1 may be a wire grid polarizer formed on the first base substrate 100.

The first base substrate 100 may include a transparent insulation substrate. For example, the first base substrate 100 may include a glass substrate, a quartz substrate, a transparent resin substrate, etc. Examples of the transparent resin substrate for the first base substrate 100 may include polyimide-based resin, acryl-based resin, polyacrylate-based resin, polycarbonate-based resin, polyether-based resin, sulfonic acid containing resin, polyethyleneterephthalate-based resin, etc.

The buffer layer 110 may be disposed on the first base substrate 100. If a top surface of the first base substrate 100 is not planar, the buffer layer 110 may be planarized. The buffer layer 110 may be formed using an inorganic insulation material, or an organic insulation material.

The gate pattern may be disposed on the buffer layer 110. The gate pattern may include a first gate line GL1, a second gate line GL2, a third gate line GL3, a first floating electrode FE1, a second floating electrode FE2 and a third floating electrode FE3. The gate pattern may include a metal such as aluminum (Al), copper (Cu), titanium (Ti), etc.

Each of the first gate line GL1, the second gate line GL2 and the third gate line GL3 may extend in the first direction D1 and be spaced apart from each other in the second direction D2. The first gate line GL1 may be electrically connected to a gate electrode GE of the first thin film transistor TFT1 and a gate electrode of a second thin film transistor TFT2. The second gate line GL2 may be electrically connected to a gate electrode of a third thin film transistor TFT3 and a gate electrode of a fourth thin film transistor TFT4. The third gate line GL3 may be electrically connected to a gate electrode of a fifth thin film transistor TFT5 and a gate electrode of a sixth thin film transistor TFT6.

The first floating electrode FE1 may be disposed at boundaries of the first to sixth pixel areas PX1 to PX6 and the light blocking areas BM, so that the first floating electrode FE1 may block light where light leakage occurs due to difficulty in liquid crystal control. The second floating electrode FE2 may be formed to be overlapped with a stem of the pixel electrode PE where a slit is not formed, so that the second floating electrode FE2 may block light where light leakage occurs due to difficulty in liquid crystal control. The third floating electrode FE3 may be formed to be overlapped with edges of the pixel electrode PE, so that the third floating electrode FE3 may block light where light leakage occurs due to difficulty in liquid crystal control. As shown in the figure, the first, second, and third floating electrodes FE1, FE2, and FE3 may be formed corresponding to respective pixel areas.

The first insulation layer 120 may be disposed on the buffer layer 110 on which the gate pattern is formed. The first insulation layer 120 may include a silicon compound, metal oxide, etc. For example, the first insulation layer 120 may be formed using silicon oxide (SiOx), silicon nitride (SiNx), silicon oxynitride (SiOxNy), aluminum oxide (AlOx), tantalum oxide (TaOx), hafnium oxide (HfOx), zirconium oxide (ZrOx), titanium oxide (TiOx), etc. These may be used alone or in a combination thereof. The first insulation layer 120 may be uniformly formed on the first base substrate 100 along a profile of the gate pattern. Here, the first insulation layer 120 may have a substantially small thickness, such that a stepped portion may be formed at a portion of the gate pattern. In some example embodiments, the first insulation layer 120 may have a relatively large thickness for sufficiently covering the gate pattern The active pattern ACT and a data pattern on the active pattern ACT may be disposed on the first insulation layer 120. The active pattern ACT and the data pattern may be simultaneously formed using an etch-back process or the like.

The active pattern ACT may include a source area which overlaps a source electrode SE, a drain area which overlaps a drain electrode DE and a channel area between the source area and the drain area. The active pattern ACT may include a semiconductor layer consisting of amorphous silicon (a-Si: H) and an ohmic contact layer consisting of n+ amorphous silicon (n+ a-Si:H) which makes contact with the source electrode SE or the drain electrode DE. In addition, the active pattern ACT may include an oxide semiconductor. The oxide semiconductor may include an amorphous oxide including at least one selected from the group consisting of indium (In), zinc (Zn), gallium (Ga), tin (Sn) and hafnium (Hf).

The data pattern may include a first data line DL1, a second data line DL2, the source electrode SE, and the drain electrode DE. The data pattern may include a metal such as aluminum (Al), copper (Cu), titanium (Ti), etc.

Each of the first data line DL1 and the second data line DL2 may extend in the second direction D2 and be spaced apart from each other in the first direction D1. The first data line DL1 may be electrically connected to the source electrode SE of the first thin film transistor TFT1, a source electrode of the third thin film transistor TFT3, and a source electrode of the fifth thin film transistor TFT5. The second data line DL2 may be electrically connected to a source electrode of the second thin film transistor TFT2, a source electrode of the fourth thin film transistor TFT4, and a source electrode of the sixth thin film transistor TFT6.

The first color filter R may be disposed on the first insulation layer 120 on which the data pattern is disposed. The first color filter R may provide color to light transmitted through the liquid crystal layer LC. The first color filter R may be a red color filter The first color filter R may be disposed in the first pixel area PX1, the second pixel area PX2, and the light blocking area BM. More specifically, referring again to FIG. 3A, the first color filter R may be formed in a portion of the light blocking area BM adjacent to the first pixel area PX1 where the first thin film transistor TFT1 is disposed, the first pixel area PX1, a portion of the light blocking area BM between the first pixel area PX1 and the second pixel area PX2, and the second pixel area PX2 along the first direction D1. In addition, the first color filter R may be formed in the portion of the light blocking area BM where the first thin film transistor TFT1 is disposed, a portion of the light blocking area BM where the third thin film transistor TFT3 is disposed, and a portion of the light blocking area BM where the fifth thin film transistor TFT5 is disposed along the second direction D2. In addition, the first color filter R may be formed in a portion of the light blocking area BM where the second thin film transistor TFT2 is disposed, a portion of the light blocking area BM where the fourth thin film transistor TFT4 is disposed, and a portion of the light blocking area BM where the sixth thin film transistor TFT6 is disposed along the second direction D2.

Thus, the first color filter R may be formed in a strip shape along a plurality of pixel areas in the first direction D1 and may be formed in the light blocking area BM corresponding to a plurality of pixel areas in the second direction D2

In addition, an opening ROP where the first color filter R is not formed may be formed corresponding to a contact hole for the pixel electrode corresponding to each of the pixel areas.

The second color filter G may be formed on the first insulation layer 120 on which the first color filter R is formed. The second color filter G may provide color to light transmitted through the liquid crystal layer LC. The second color filter G may be a green color filter.

The second color filter G may be disposed in the third pixel area PX3 and the fourth pixel area PX4. More specifically, referring again to FIG. 3B, the second color filter G may be formed in the third pixel area PX3 and the fourth pixel area PX4, along the first direction D1. A bridge portion GBR may be disposed in the light blocking area BM. The bridge portion GBR may be disposed in a portion of the light blocking area BM where is between two pixel areas in which the second color filter G is disposed, so that the bridge portion GBR may connect the second color filter G of the two pixel areas.

The bridge portion GBR may overlap the first color filter R and the third color filter B. Accordingly, in a portion where the bridge portion GBR is formed, the first color filter R, the second color filter G, and the third color filter B overlap each other to function as a second sub-column spacer SCS2 (refers to FIGS. 2 and 5B).

In addition, the bridge portion GBR is formed so as not to overlap with a contact hole CNT (see FIGS. 4A, 4B) for the pixel electrode PE and the third or fourth thin film transistor TFT3 or TFT4. This is because the contact hole CNT should be formed through the first to third color filters R, G, B, and in a portion where the third or fourth thin film transistor TFT3 or TFT4 is formed, a lower film thickness by the structure of the thin film transistors is high, so that it is not a proper position for the second sub-column spacer SCS2.

The bridge portion GBR may be integrally formed with the second color filter G in the pixel areas.

Thus, the second color filter G may be formed in a strip shape along the first direction D1 across a plurality of pixel areas. In the light blocking area BM between two pixels areas in which the second color filter G is formed, the bridge portion GBR may be formed to connect the second color filter G in the two pixel areas.

The third color filter B may be disposed on the first insulation layer 120 on which the first and second color filters R and G are disposed. The third color filter B may provide color to light transmitted through the liquid crystal layer LC. The third color filter B may be a blue color filter.

The third color filter B may be disposed in the fifth pixel area PX5, the sixth pixel area PX6 and the light blocking area BM. More specifically, referring again to FIG. 3C, the third color filter B may be formed in a portion of the light blocking area BM adjacent to the fifth pixel area PX5 where the fifth thin film transistor TFT5 is disposed, the fifth pixel area PX5, a portion of the light blocking area BM between the fifth pixel area PX5 and the sixth pixel area PX6, and the sixth pixel area PX6 along the first direction D1. In addition, the third color filter B may be formed in the portion of the light blocking area BM where the first thin film transistor TFT1 is disposed, a portion of the light blocking area BM where the third thin film transistor TFT3 is disposed, and a portion of the light blocking area BM where the fifth thin film transistor TFT5 is disposed, along the second direction D2. In addition, the third color filter B may be formed in a portion of the light blocking area BM where the second thin film transistor TFT2 is disposed, a portion of the light blocking area BM where the fourth thin film transistor TFT4 is disposed, and a portion of the light blocking area BM where the sixth thin film transistor TFT6 is disposed, along the second direction D2.

Thus, the third color filter B may be formed in a strip shape along a plurality of pixel areas in the first direction D1 and may be formed in the light blocking area BM corresponding to a plurality of pixel areas in the second direction D2.

In addition, an opening BOP where the third color filter B is not formed may be formed corresponding to a contact hole for the pixel electrode corresponding to each of the pixel areas.

Accordingly, the first thin film transistor TFT1 including the gate electrode GE, the active pattern ACT, the source electrode SE and the drain electrode DE may be formed corresponding to the first pixel area PX1 in which the first color filter R is disposed. The second thin film transistor TFT2 may be formed corresponding to the second pixel PX2 in which the first color filter R is disposed. The third thin film transistor TFT3 may be formed corresponding to the third pixel area PX3 in which the second color filter G is disposed. The fourth thin film transistor TFT4 may be formed corresponding to the fourth pixel area PX4 in which the second color filter G is disposed. The fifth thin film transistor TFT5 may be formed corresponding to the fifth pixel area PX5 in which the third color filter B is disposed.

The sixth thin film transistor TFT6 may be formed corresponding to the sixth pixel area PX6 in which the third color filter B is disposed.

The organic insulation layer 130 may be disposed on the first, second, and third color filters R, G and B. The organic insulation layer 130 may include organic insulation material. The organic insulation layer 130 may cover the first, second, and third color filters R, G and B, and have a flat upper surface.

The transparent electrode pattern may be disposed on the organic insulation layer 130. The transparent electrode pattern may include a transparent conductive material. For example, the transparent electrode pattern may include indium tin oxide (ITO), indium zinc oxide (IZO), etc. The transparent electrode pattern may include the shielding electrode SCOM and the pixel electrode PE.

Referring again to FIG. 4, the shielding electrode SCOM may overlap the first and second data lines DL1 and DL2, the first, second, and third gate lines GL1, GL2 and GL3. Accordingly, the shielding electrode SCOM may form a mesh structure along the light blocking area BM. A shielding voltage may be applied to the shielding electrode SCOM, so that the liquid crystal of the liquid crystal layer LC corresponding to the shielding electrode SCOM may be controlled in a black state.

The pixel electrode PE may be formed to correspond to each of the first to sixth pixel areas PX1 to PX6. The pixel electrode PE may be electrically connected to the drain electrode of the thin film transistor through a contact hole. The contact hole may be formed through the organic insulation layer 130, the first, second, and third color filters R, G and B, and expose the drain electrode or a contact pad connected to the drain electrode.

The pixel electrode PE may include a stem extending in the first direction D1 or the second direction D2. A plurality of slits SL extending from the stem to an edge of the pixel electrode PE may be formed at the pixel electrode PE. The stem of the pixel electrode PE may be disposed to overlap the first, second or third floating electrode FE1, FE2 or FE3.

The main column spacer MCS and the first sub-column spacer SCS1 may be disposed on organic insulation layer 130. The main column spacer MCS may make contact with the upper substrate to maintain a cell-gap between the upper substrate and the lower substrate. The first alignment layer AL1 may be further disposed between the main column spacer MCS and the upper substrate. The main column spacer MCS may be disposed to overlap the sixth thin film transistor TFT6. The main column spacer MCS may be formed in the required number in addition to those shown in the drawings.

The first sub-column spacer SCS1 may be formed lower than the main column spacer MCS. A pressing gap can be maintained by the first sub-column spacer SCS1 when the liquid crystal display apparatus is pressed by an external force. The first sub-column spacer SCS1 may be overlapped with the first thin film transistor TFT1 and the second thin film transistor TFT2. The first sub-column spacer SCS1 may be formed in the required number in addition to those shown in the drawings. The first sub-column spacer SCS1 may be formed with the main column spacer MCS using a half-tone mask, or the like.

The first sub-column spacer SCS1 may be formed in a greater number than the main column spacer MCS. Thus, for the display apparatus as a whole, a density of the main column spacers MCS may be less than a density of the first sub-column spacers SCS1. In addition, the display apparatus may include the second sub-column spacer SCS2 which will be mentioned later, and the first sub-column spacer SCS1 can be eliminated.

In addition, referring again to FIG. 5B, an area where the first color filter R, the second color filter G and the third color filter B overlap each other, which is an area where the bridge portion GBR is disposed, is higher than an area where one or two of the color filters is disposed from the first base substrate 100, so that the area may form the second sub-column spacer SCS2. Accordingly, the pressing gap may be effectively maintained with the first sub-column spacer SCS1.

Especially, since layers constituting the second sub-column spacer SCS2 are formed through a full tone exposure process without using a halftone mask, deviation of the second sub-column spacers SCS2 are very small. In the case of the first sub-column spacer SCS1, which is generally formed using a halftone mask, a height deviation of the first sub-column spacers SCS1 may occur. In the case of the second sub-column spacer SCS2 formed without the halftone mask, deviation of the second sub-column spacers SCS2 may be very small. Thus, a plurality of the second sub-column spacers SCS2 having a uniform height can be formed.

In the present embodiment, the main column spacer MCS and the first sub-column spacer SCS1 are disposed so as not to overlap with the shielding electrode SCOM. However, the main column spacer MCS and the first sub-column spacer SCS1 may be overlapped with the shielding electrode SCOM as need.

The first alignment layer AL1 may be disposed on the transparent electrode pattern, the main column spacer MCS, the first sub-column spacer SCS1 and the organic insulation layer 130. The first alignment layer AL1 may include an alignment material capable of aligning the liquid crystal molecules of the liquid crystal layer LC.

The upper substrate may include a second base substrate 200, a common electrode CE, a second alignment layer AL2 and a second polarizer POL2.

The second base substrate 200 may include a transparent insulation substrate. For example, the second base substrate 200 may include a glass substrate, a quartz substrate, a transparent resin substrate, etc. Examples of the transparent resin substrate for the second base substrate 200 may include polyimide-based resin, acryl-based resin, polyacrylate-based resin, polycarbonate-based resin, polyether-based resin, sulfonic acid containing resin, polyethyleneterephthalate-based resin, etc.

The common electrode CE may be disposed on the second base substrate 200. A common voltage may be applied to the common electrode CE. The common electrode CE may include a transparent conductive material. For example, the common electrode CE may include indium tin oxide (ITO), indium zinc oxide (IZO), etc.

The second alignment layer AL2 may be disposed on the common electrode CE. The second alignment layer AL2 may include an alignment material capable of aligning the liquid crystal molecules of the liquid crystal layer LC. Meanwhile, the first and second alignment layers AL1 and AL2 may be eliminated according to the constituent material of the liquid crystal layer LC if necessary. When the display apparatus does not include the first and second alignment layers AL1 and AL2, the main column spacer MCS may make contact with the common electrode directly.

The second polarizer POL2 may be attached on a surface of the second base substrate 200 opposite to a surface of the second base substrate 200 on which the common electrode CE is formed. The second polarizer POL2 may polarize transmitted light, and a commonly used polyvinyl alcohol (PVA) polarizer can be used. A polarizing axis of the second polarizer POL2 may be perpendicular to a polarizing axis of the first polarizer POL1 Although not shown in the figures, in some example embodiment, the second polarizer POL2 may be a wire grid polarizer formed on the second base substrate 200.

The liquid crystal layer LC may be disposed between the first alignment layer AL1 and the second alignment layer AL2. The liquid crystal layer LC may include liquid crystal molecules having optical anisotropy. The liquid crystal molecules are driven by an electric field, so that an image is displayed by passing or blocking light through the liquid crystal layer LC.

According to the present example embodiment, the light blocking area BM may further overlap the gate lines, so that the light blocking area BM may have a mesh structure. In a portion of the light blocking area BM where extends in the second direction D2, light blocking function may be improved by overlapping of the first and third color filters R and B, the first floating electrode FE1, the gate and data pattern, and the shielding electrode SCOM.

In addition, in a portion of the light blocking area BM extending in the first direction D1, light blocking function can be improved by the gate line and the shielding electrode SCOM. Accordingly, the display apparatus may implement a light blocking area without an additional layer for light blocking.

In addition, since the second sub-column spacer SCS2 is formed by the bridge portion GBR, the pressing gap of the display apparatus can be effectively maintained.

Figure 6:
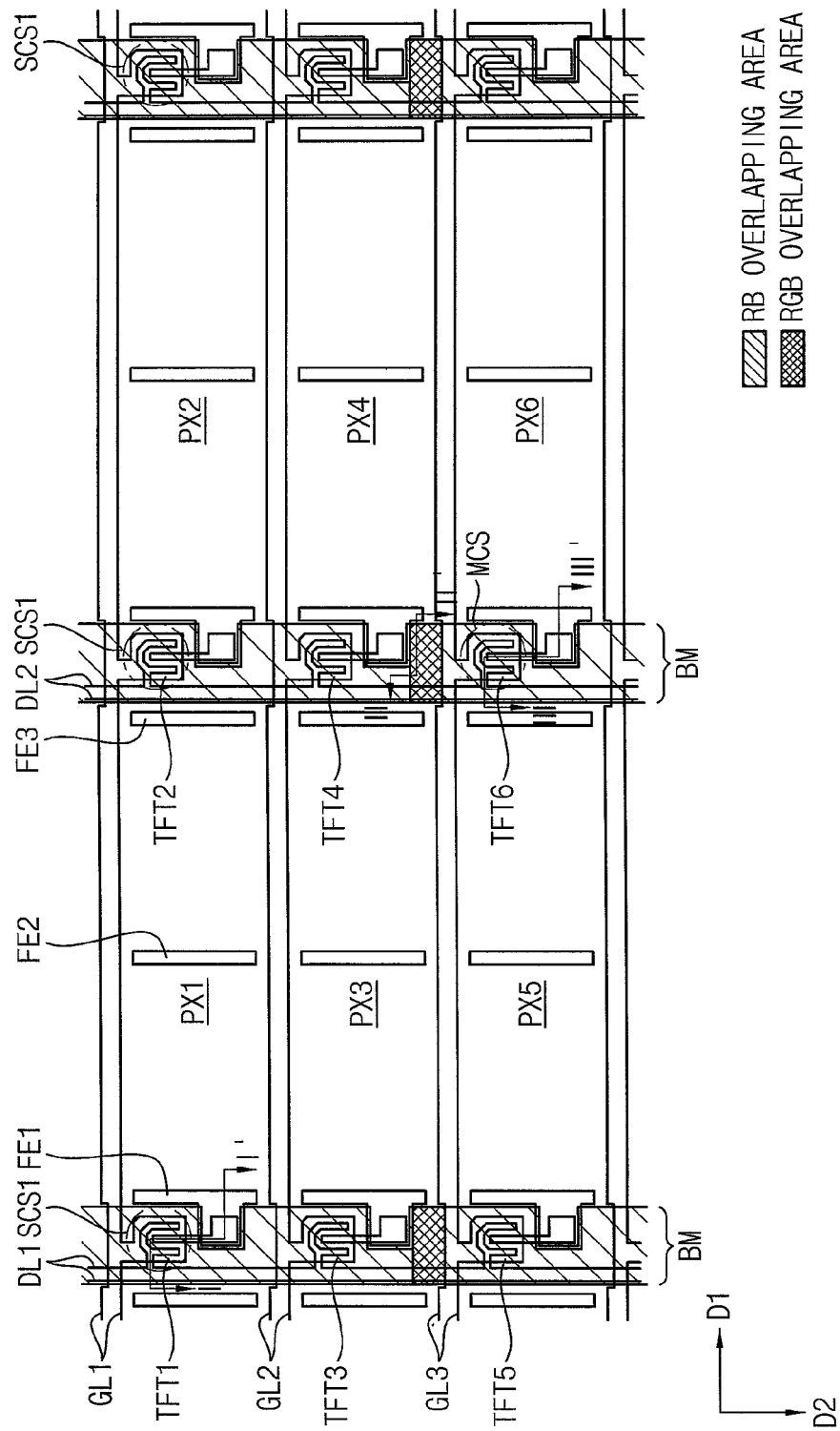
FIG. 6 is a plan view illustrating first to sixth pixel areas of a display apparatus according to an example embodiment of the inventive concept.
Figure 7:
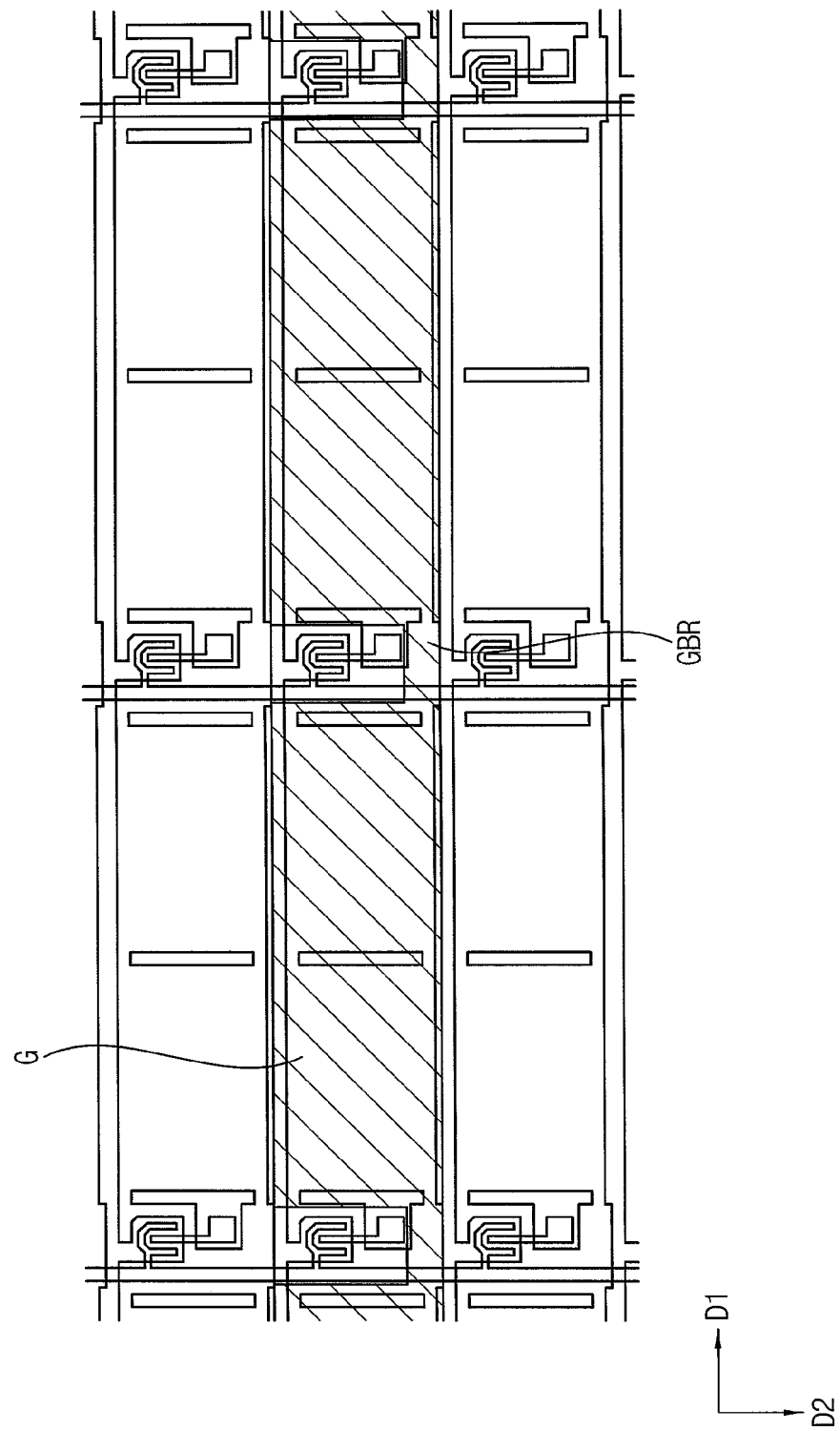
FIG. 7 is a plan view illustrating a second color filter of the display apparatus of FIG. 6.
Figure 8A:
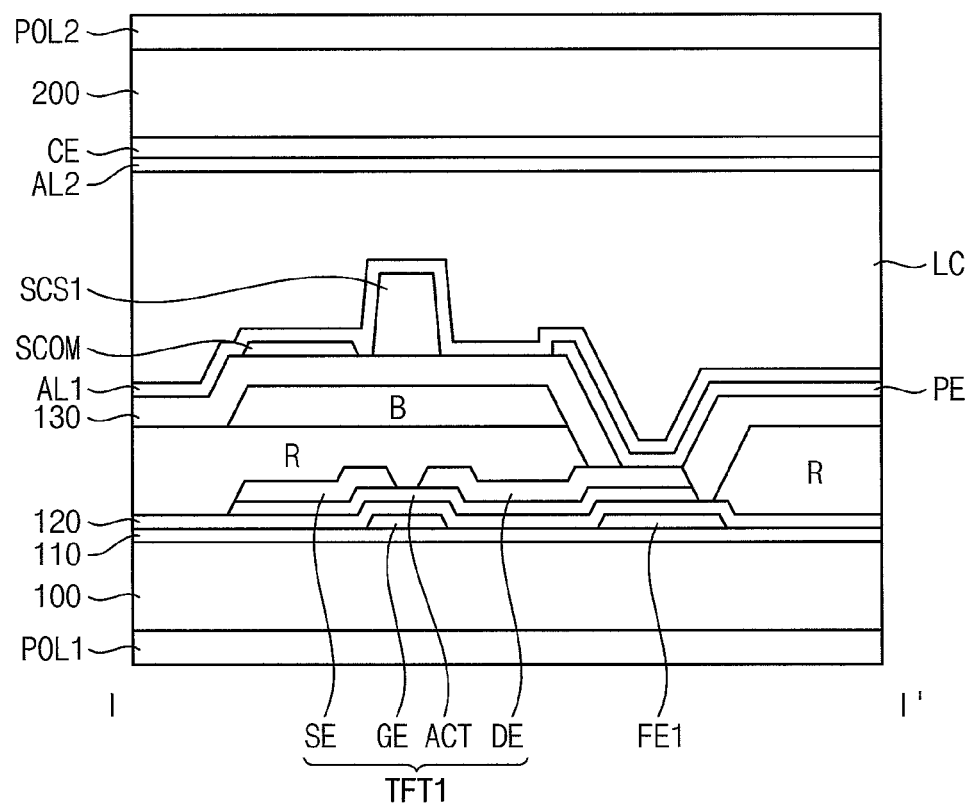
FIGS. 8A, 8B and 8C are cross-sectional views taken along line I-I', II-II' and III-III' of the display apparatus of FIG. 6, respectively.
Figure 8B:
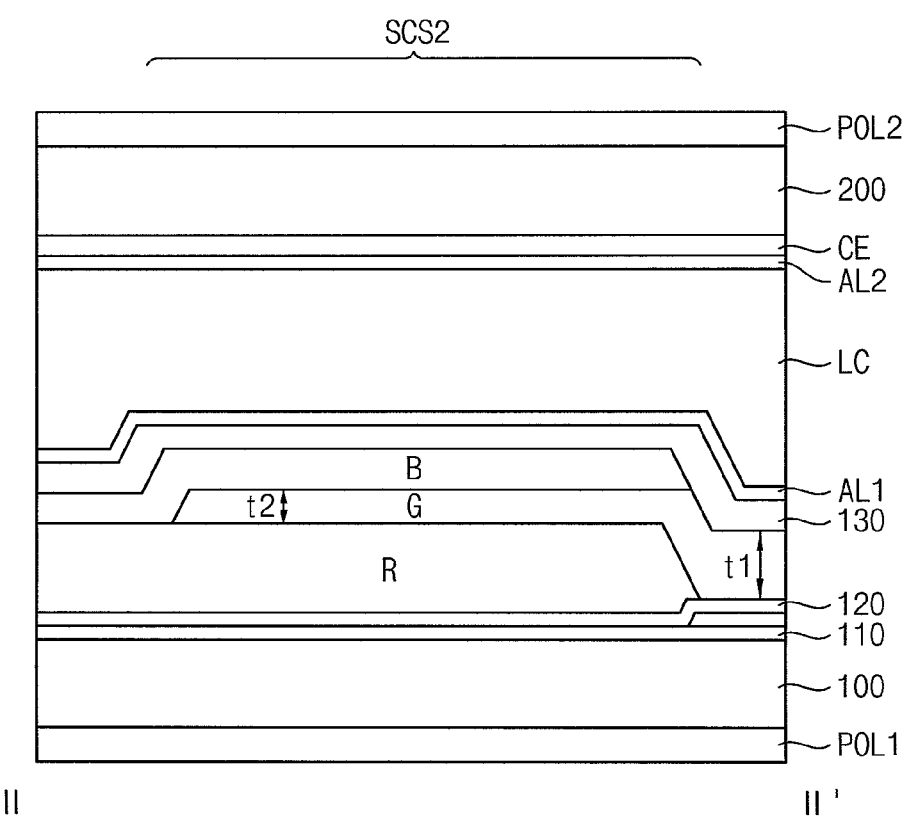
Figure 8C:
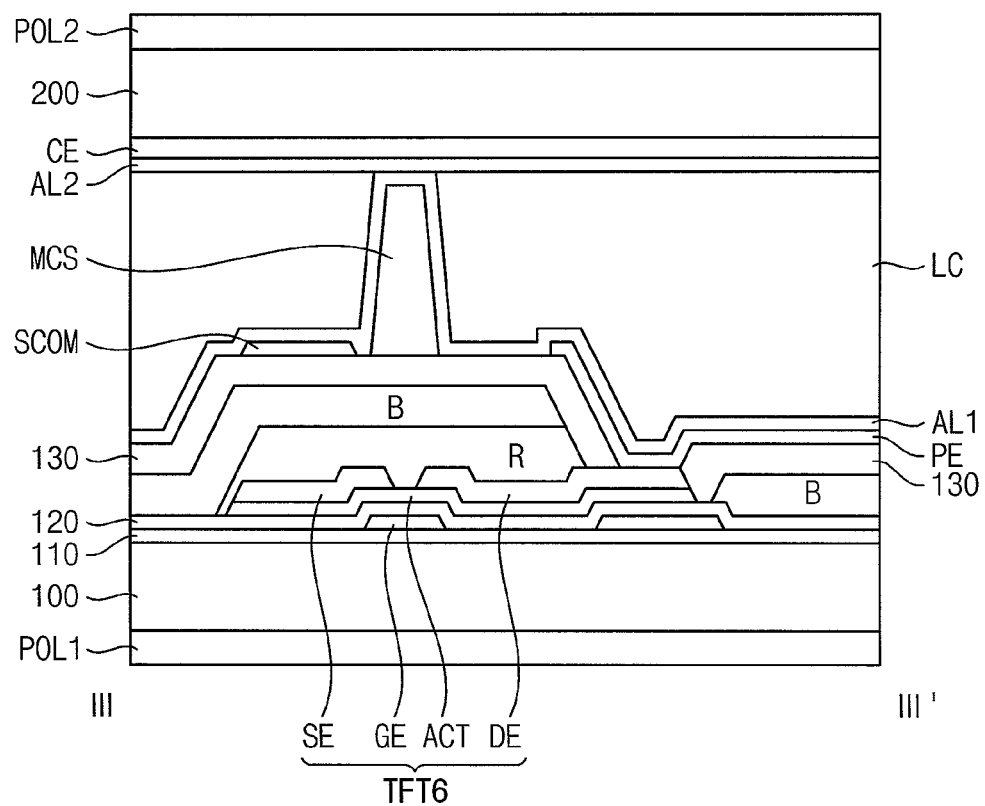

FIG. 6 is a plan view illustrating first to sixth pixel areas PX1 to PX6 of a display apparatus according to an example embodiment of the inventive concept. FIG. 7 is a plan view illustrating a second color filter G of the display apparatus of FIG. 6. FIGS. 8A, 8B and 8C are cross-sectional views taken along line I-I', II-II' and III-III' of the display apparatus of FIG. 6, respectively.

Referring to FIGS. 6, 7, 8A and 8B, the display apparatus may be substantially same as the display apparatus of FIG. 2, except for a second color filter G. Therefore, repeated description is omitted.

The second color filter G may be disposed in a third pixel area PX3 and a fourth pixel area PX4. More specifically, referring again to FIG. 7, the second color filter G may be formed in the third pixel area PX3 and the fourth pixel area PX4 along a first direction D1. A bridge portion GBR may be disposed in the light blocking area BM. The bridge portion GBR may be disposed in a portion of the light blocking area BM between two pixel areas in which the second color filter G is disposed, so that the bridge portion GBR may connect the second color filter G of the two pixel areas.

The second color filter G may have a first thickness t1 at the third pixel area PX3 and the fourth pixel area PX4. The bridge portion GBR may have a second thickness t2 which is smaller than the first thickness t1 in the light blocking area BM.

The bridge portion GBR may overlap the first color filter R and the third color filter B. Accordingly, in a portion where the bridge portion GBR is formed, the first color filter R, the bridge portion GBR and the third color filter B overlap each other to function as a second sub-column spacer SCS2. Here, the bridge portion GBR having the second thickness t2 may be formed using a half-tone mask or the like. Thus, the second color filter G having the first thickness t1 may be formed by full tone exposure, and the bridge portion GBR having the second thickness t2 may be formed by a half tine exposure.

Accordingly, a height of the second sub-column spacer SCS2 may be lower than the second sub-column spacer of the display apparatus of FIG. 2. Thus, it is possible to adjust the height of the second sub-column spacer SCS2 by adjusting the thickness of the bridge portion GBR.

Figure 9:
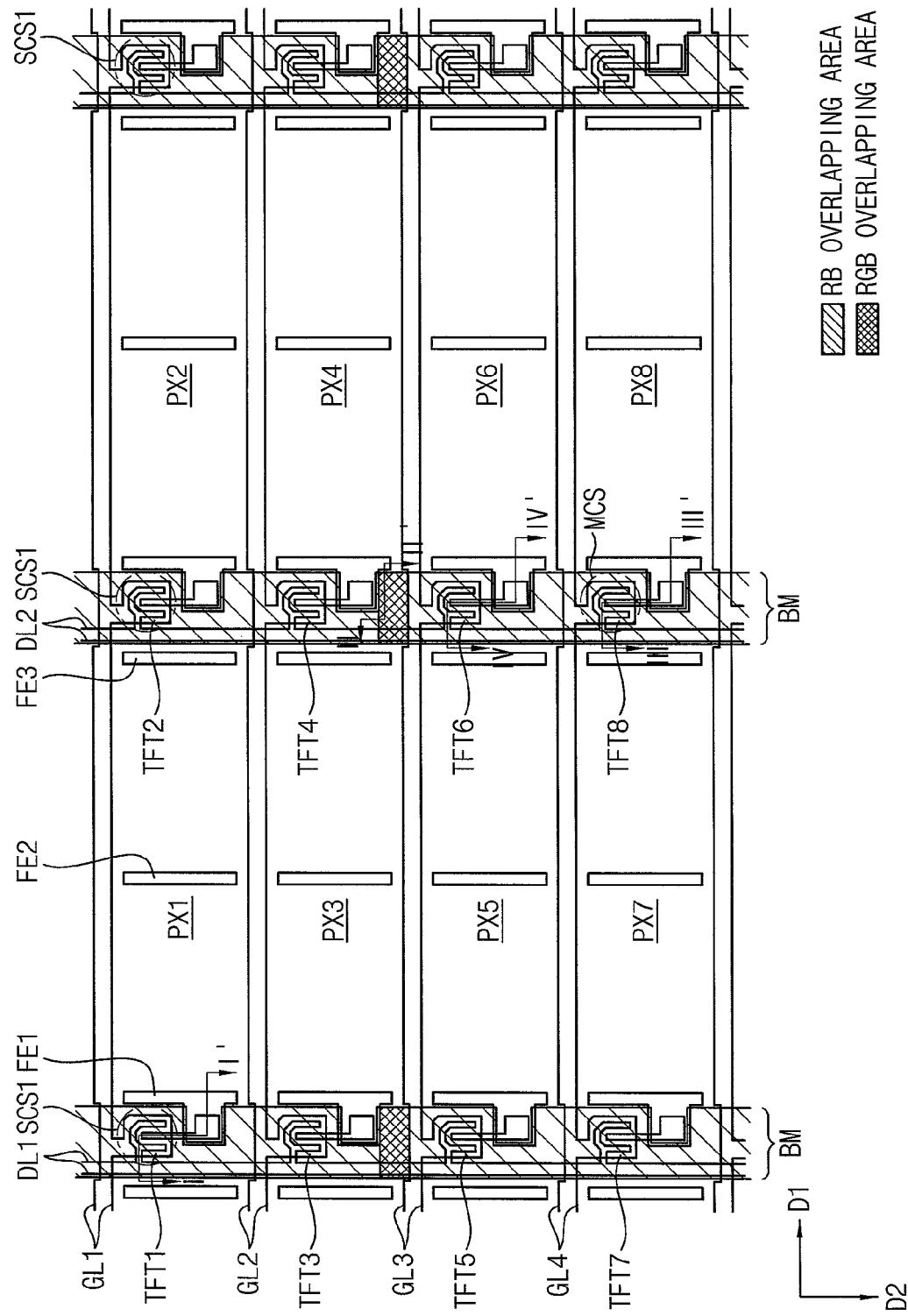
FIG. 9 is a plan view illustrating first to eighth pixel areas of a display apparatus according to an example embodiment of the inventive concept.
Figure 10A:
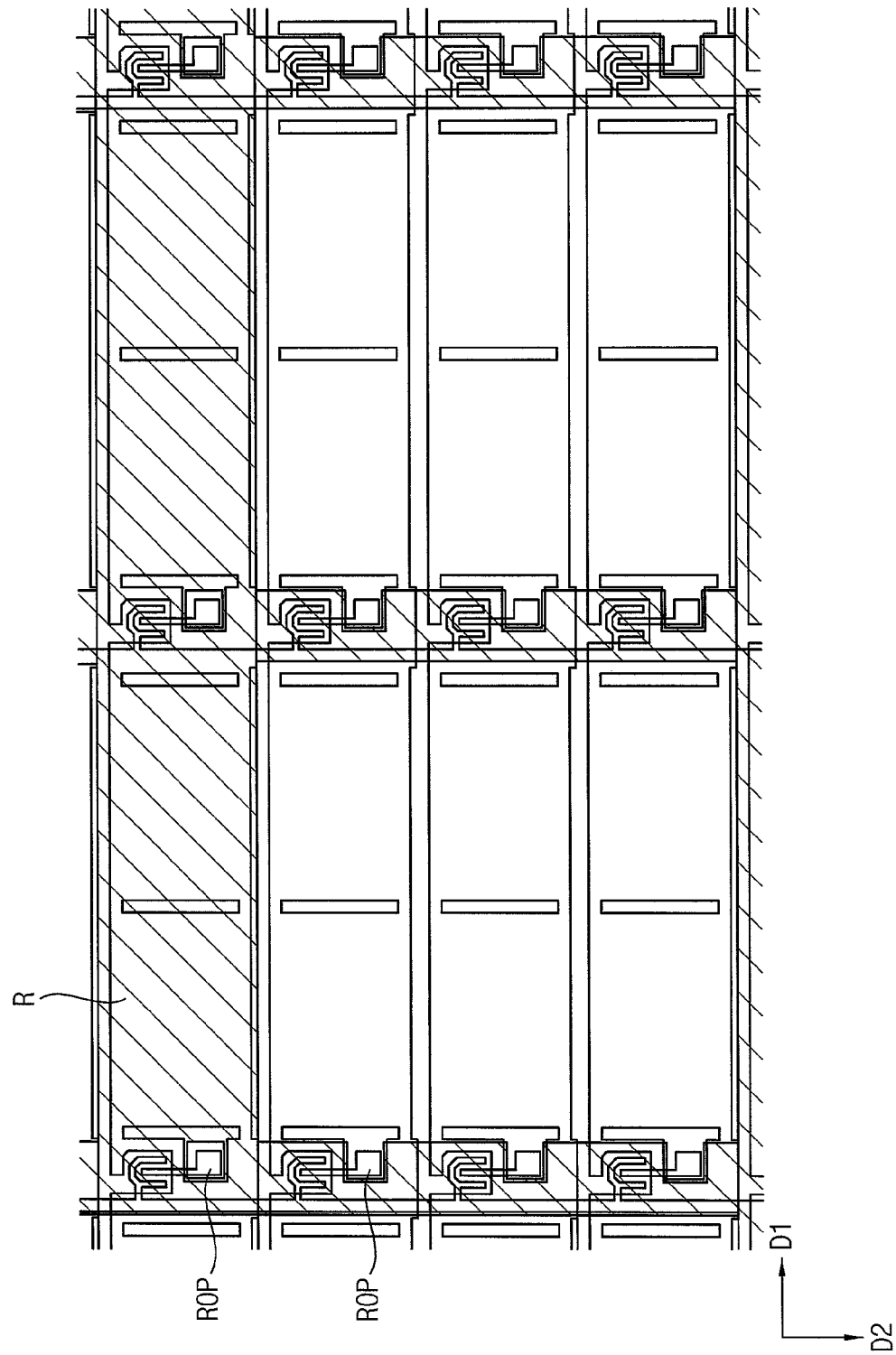
FIGS. 10A, 10B, 10C and 10D are plan views illustrating a first color filter, a second color filter, a third color filter and a fourth color filter of the display apparatus of FIG. 9, respectively.
Figure 10B:
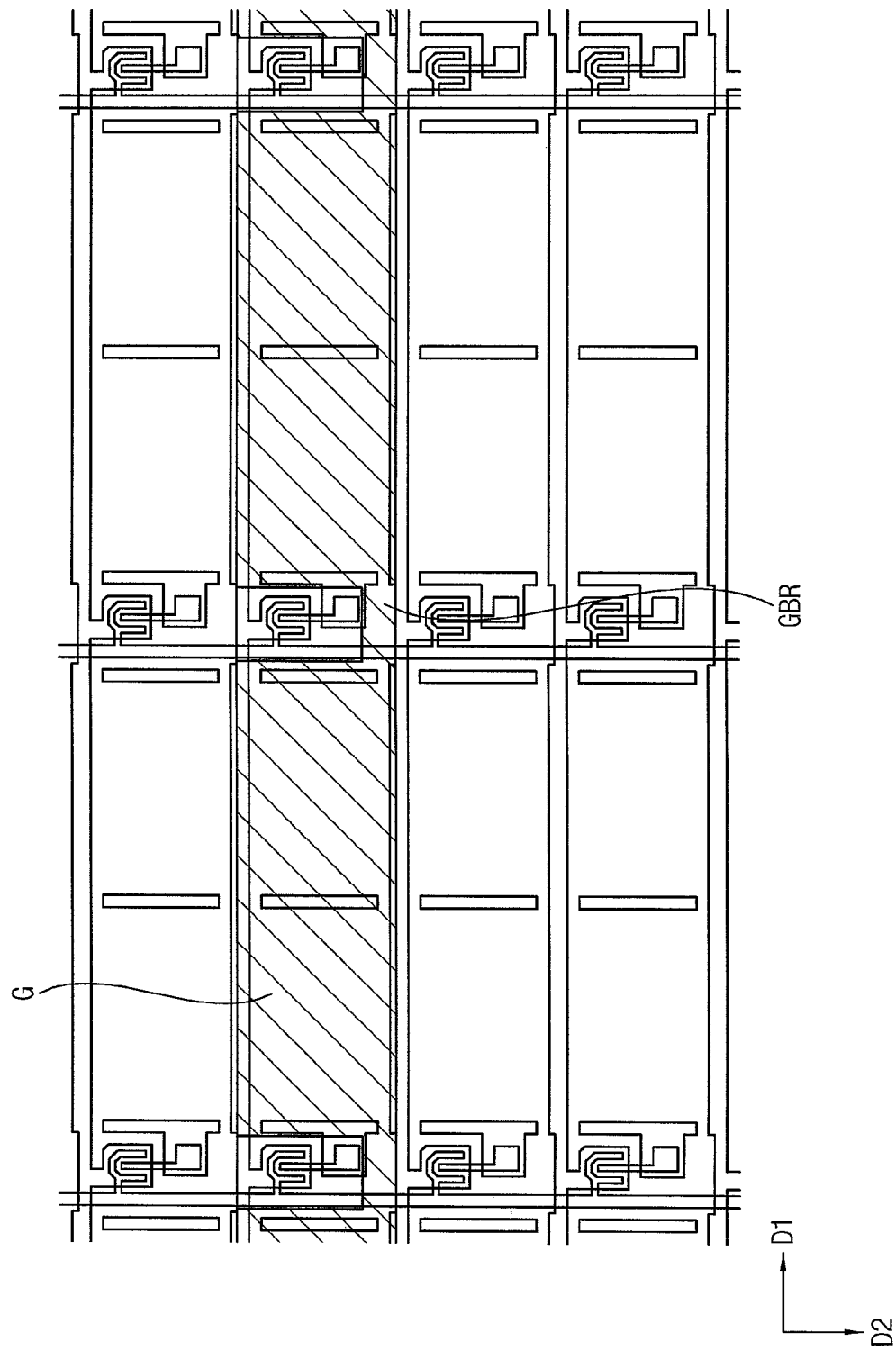
Figure 10C:
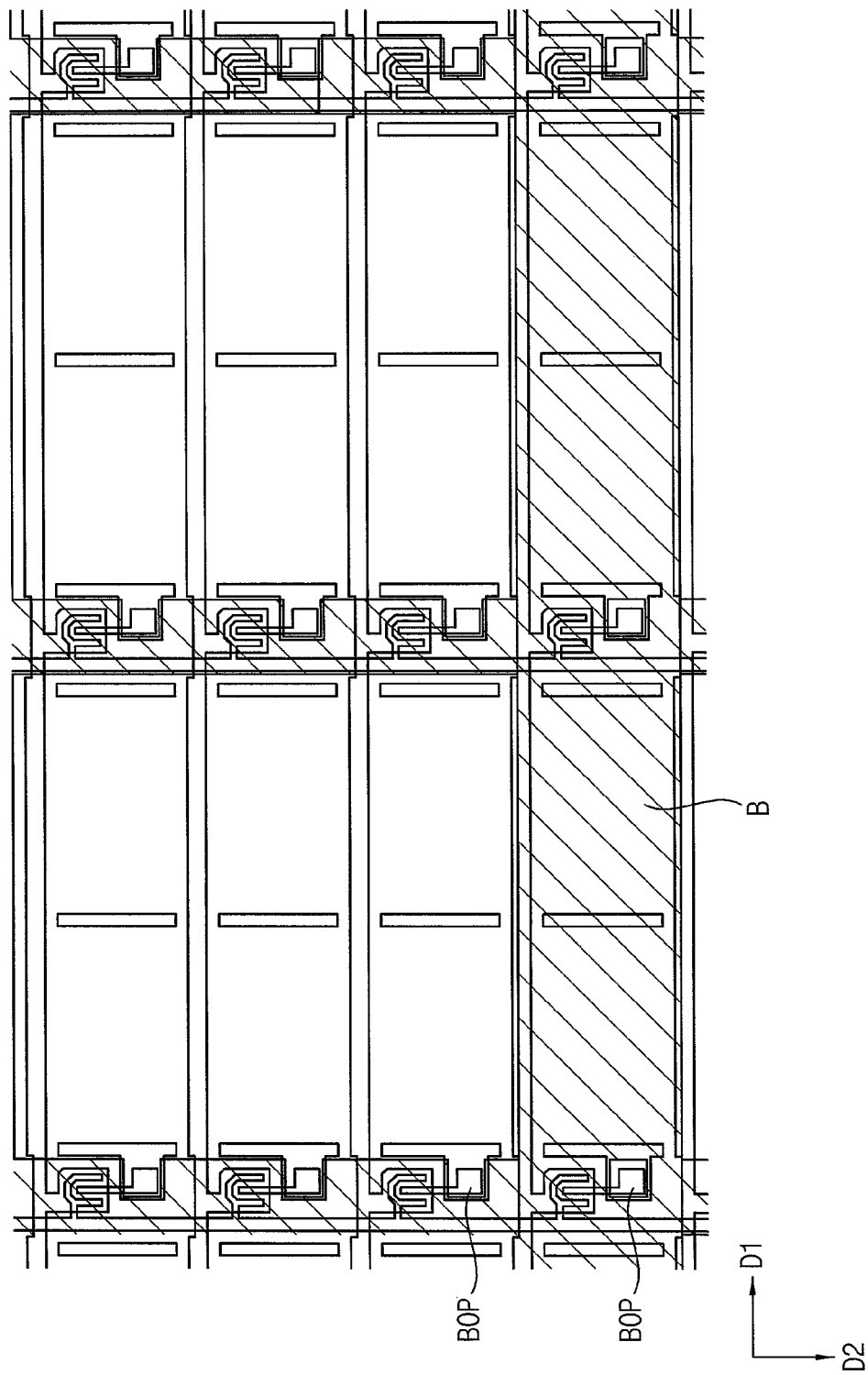
Figure 10D:
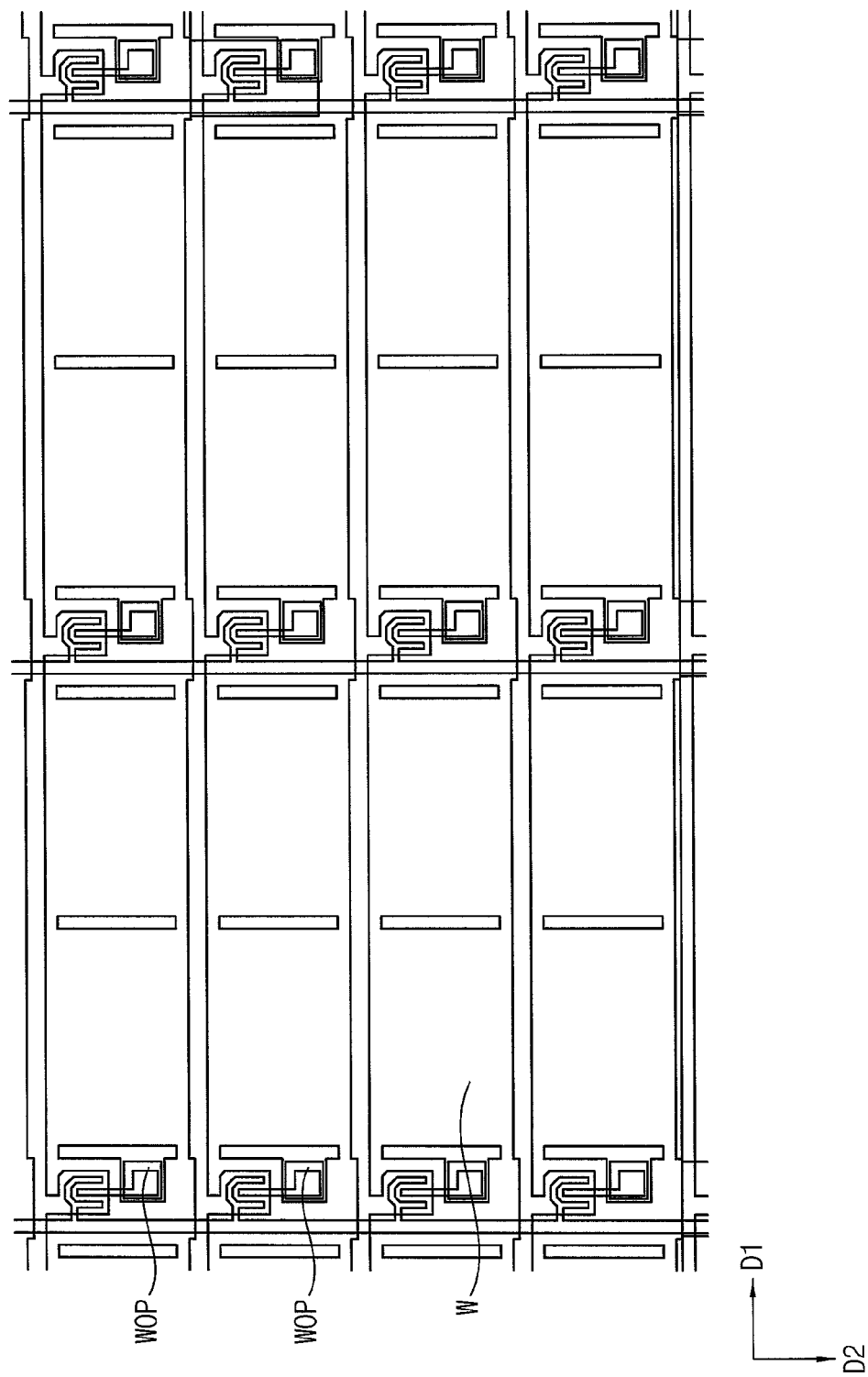
Figure 11A:
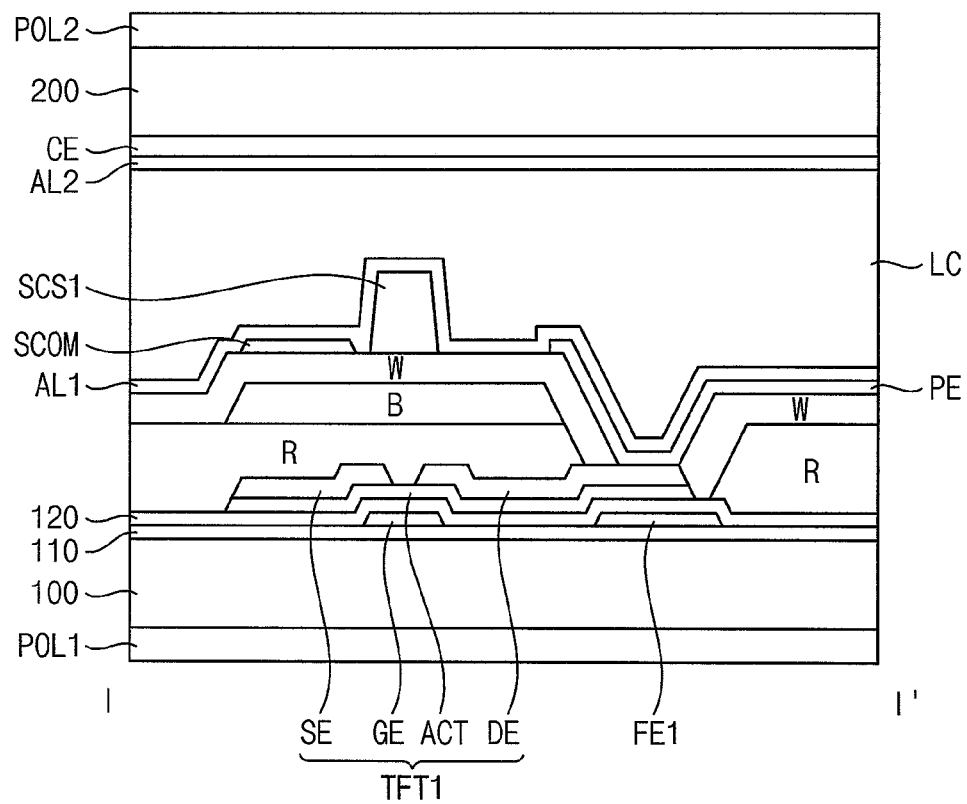
FIGS. 11A, 11B, 11C and 11D are cross-sectional views taken along line I-I', II-II', III-III', and IV-IV' of the display apparatus of FIG. 9, respectively.
Figure 11B:
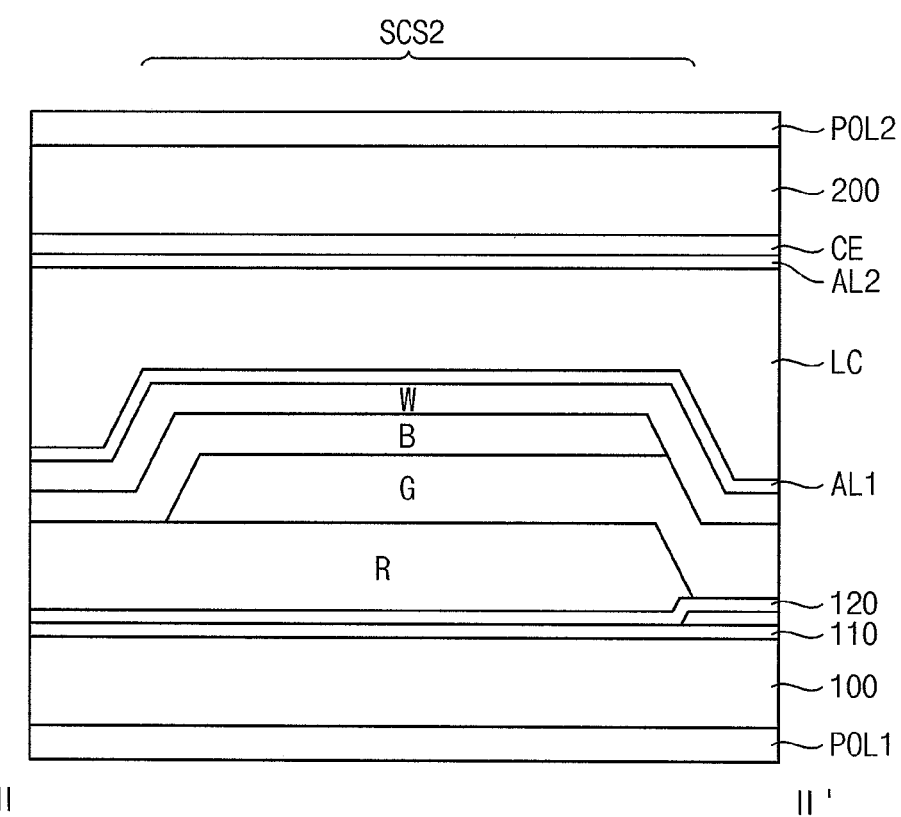
Figure 11C:
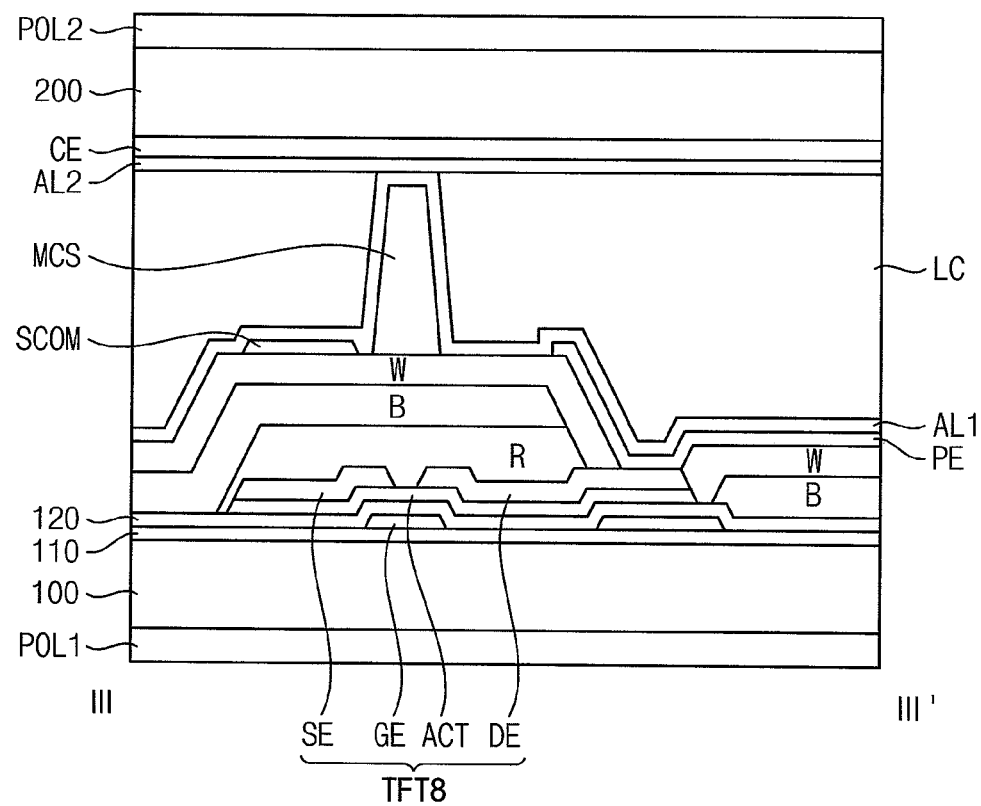
Figure 11D:
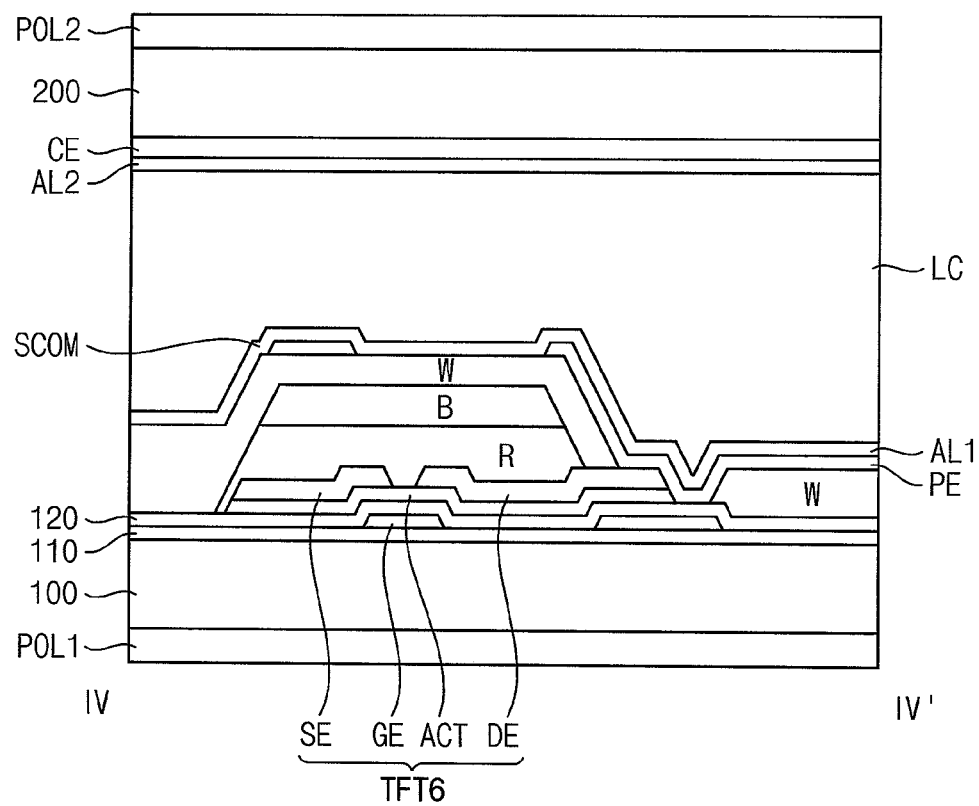

FIG. 9 is a plan view illustrating first to eighth pixel areas PX1 to PX8 of a display apparatus according to an example embodiment of the inventive concept.

FIGS. 10A, 10B, 10C, and 10D are plan views illustrating a first color filter R, a second color filter G, a third color filter B and a fourth color filter W of the display apparatus of FIG. 9, respectively. FIGS. 11A, 11B, 11C, and 11D are cross-sectional views taken along line I-I', II-II', III-III' and IV-IV' of the display apparatus of FIG. 9, respectively.

Referring to FIGS. 9, 10A, 10B, 10C, 10D, 11A, 11B, 11C and 11D, the display apparatus may be substantially same as the display apparatus of FIG. 2, except that the display apparatus further includes a fourth color filter W. Therefore, repeated description is omitted.

The display apparatus may include a first pixel area PX1, a second pixel area PX2, a third pixel area PX3, a fourth pixel area PX4, a fifth pixel area PX5, a sixth pixel area PX6, a seventh pixel area PX7, a eighth pixel area PX8, sometimes collectively referred to as the first to eighth pixel areas PX1 to PX8, and a light blocking area BM between the first to eighth pixel areas PX1 to PX8. The first to eighth pixel areas PX1 to PX8 may be arranged in a 4*2 matrix form in a second direction D2 and a first direction D1. A gate pattern may further include a fourth gate line GL4.

The first color filter R may provide color to light transmitted through the liquid crystal layer LC. The first color filter R may be a red color filter. The first color filter R may be disposed in the first pixel area PX1, the second pixel area PX2, and the light blocking area BM. More specifically, referring again to FIG. 10A, the first color filter R may be formed in a portion of the light blocking area BM adjacent to the first pixel area PX1 where a first thin film transistor TFT1 is disposed, the first pixel area PX1, a portion of the light blocking area BM between the first pixel area PX1 and the second pixel area PX2, and the second pixel area PX2, along the first direction D1. In addition, the first color filter R may be formed in the portion of the light blocking area BM where the first thin film transistor TFT1 is disposed, a portion of the light blocking area BM where a third thin film transistor TFT3 is disposed, a portion of the light blocking area BM where a fifth thin film transistor TFT5 is disposed and a portion of the light blocking area BM where a seventh thin film transistor TFT7 is disposed, along the second direction D2. In addition, the first color filter R may be formed in a portion of the light blocking area BM where a second thin film transistor TFT2 is disposed, a portion of the light blocking area BM where a fourth thin film transistor TFT4 is disposed, a portion of the light blocking area BM where a sixth thin film transistor TFT6 is disposed, and a portion of the light blocking area BM where a eighth thin film transistor TFT8 is disposed, along the second direction D2.

Thus, the first color filter R may be formed in a strip shape along a plurality of pixel areas in the first direction D1 and may be formed in the light blocking area BM corresponding to a plurality of pixel areas in the second direction D2

In addition, an opening ROP where the first color filter R is not formed may be formed corresponding to a contact hole for the pixel electrode corresponding to each of the pixel areas.

The second color filter G may provide color to light transmitted through the liquid crystal layer LC. The second color filter G may be a green color filter. The second color filter G may be disposed in the third pixel area PX3 and the fourth pixel area PX4. More specifically, referring again to FIG. 10B, the second color filter G may be formed in the third pixel area PX3 and the fourth pixel area PX4, along the first direction D1. A bridge portion GBR may be disposed in the light blocking area BM. The bridge portion GBR may be disposed in a portion of the light blocking area BM where is between two pixel areas in which the second color filter G is disposed, so that the bridge portion GBR may connect the second color filter G of the two pixel areas.

Thus, the second color filter G may be formed in a strip shape along a plurality of pixel areas in the first direction D1. The second color filters G in two adjacent pixel areas may be connected with each other by the bridge portion GBR in the light blocking area BM between the two pixel areas.

The third color filter B may provide color to light transmitted through the liquid crystal layer LC. The third color filter B may be a blue color filter. The third color filter B may be disposed in the seventh pixel area PX7, the eighth pixel area PX8 and the light blocking area BM. More specifically, referring again to FIG. 10C, the third color filter B may be formed in a portion of the light blocking area BM adjacent to the seventh pixel area PX7 where the seventh thin film transistor TFT7 is disposed, the seventh pixel area PX7, a portion of the light blocking area BM between the seventh pixel area PX7 and the eighth pixel area PX8, and the eighth pixel area PX8 along the first direction D1. In addition, the third color filter B may be formed in the portion of the light blocking area BM where the first thin film transistor TFT1 is disposed, a portion of the light blocking area BM where the third thin film transistor TFT3 is disposed, a portion of the light blocking area BM where the fifth thin film transistor TFT5 is disposed, and a portion of the light blocking area BM where the seventh thin film transistor TFT7 is disposed, along the second direction D2. In addition, the third color filter B may be formed in a portion of the light blocking area BM where the second thin film transistor TFT2 is disposed, a portion of the light blocking area BM where the fourth thin film transistor TFT4 is disposed, a portion of the light blocking area BM where the sixth thin film transistor TFT6 is disposed, and a portion of the light blocking area BM where the eighth thin film transistor TFT8 is disposed along the second direction D2.

Thus, the third color filter B may be formed in a strip shape along a plurality of pixel areas in the first direction D1 and may be formed in the light blocking area BM corresponding to a plurality of pixel areas in the second direction D2.

In addition, an opening BOP where the third color filter B is not formed may be formed corresponding to a contact hole for the pixel electrode corresponding to each of the pixel areas.

The fourth color filter W may be a transparent color filter, and may be disposed in the entirety of the first to eighth pixel areas PX1 to PX8. Accordingly, the fifth pixel area PX5 and the sixth pixel area PX6 may perform a function as a white pixel. An opening WOP where the fourth color filter W is not formed may be formed corresponding to a contact hole for the pixel electrode corresponding to each of the pixel areas.

Since the fourth color filter W is transparent, it may be formed over the first base substrate 100 as well as the fifth pixel area PX5 and the sixth pixel area PX6. Accordingly, an organic insulation layer 130 (see FIG. 5A) can be omitted, unlike the display apparatus of FIG. 2.

Figure 12:
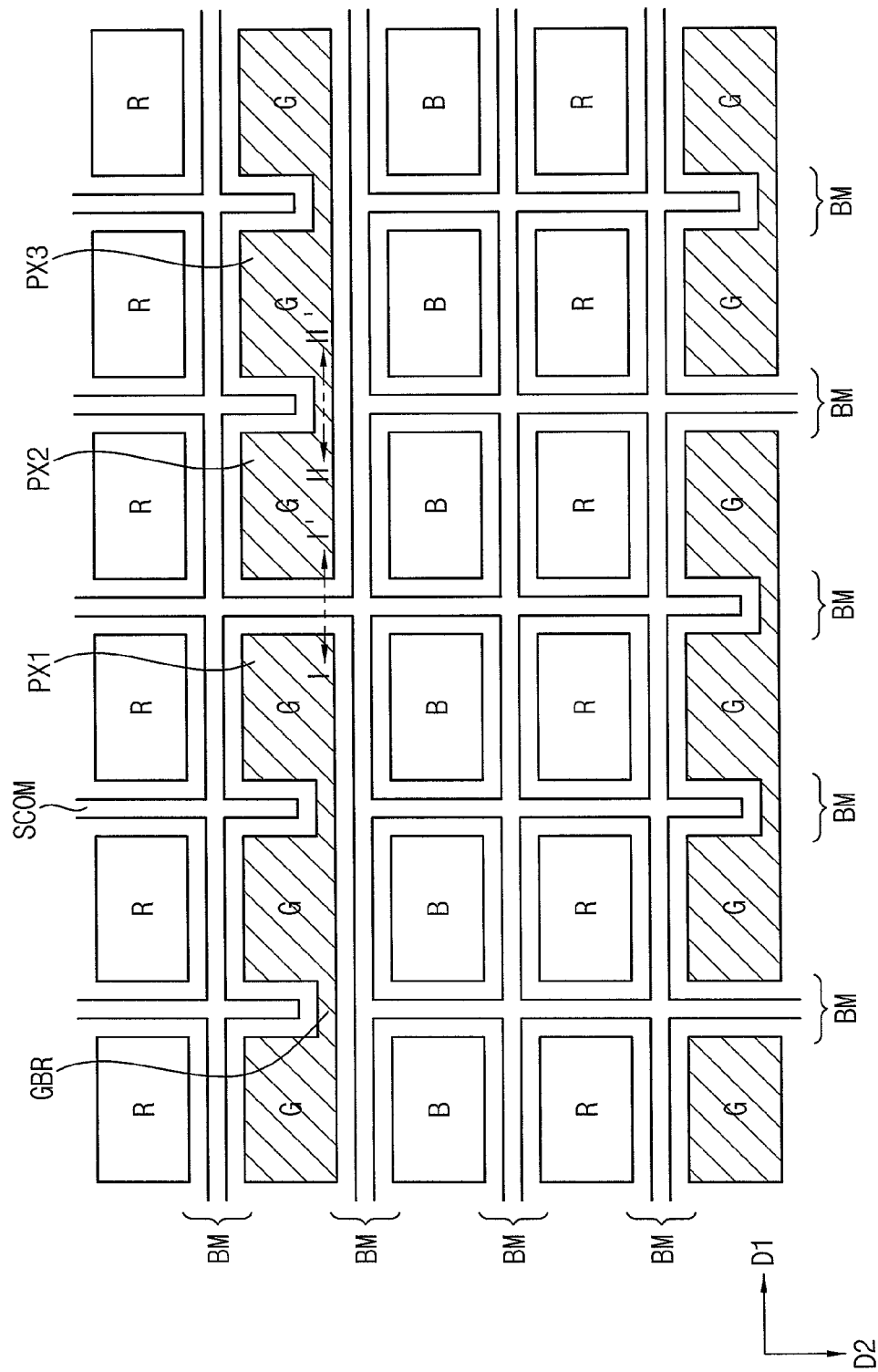
FIG. 12 is a plan view briefly illustrating pixel areas of a display apparatus according to an example embodiment of the inventive concept.
Figure 13A:
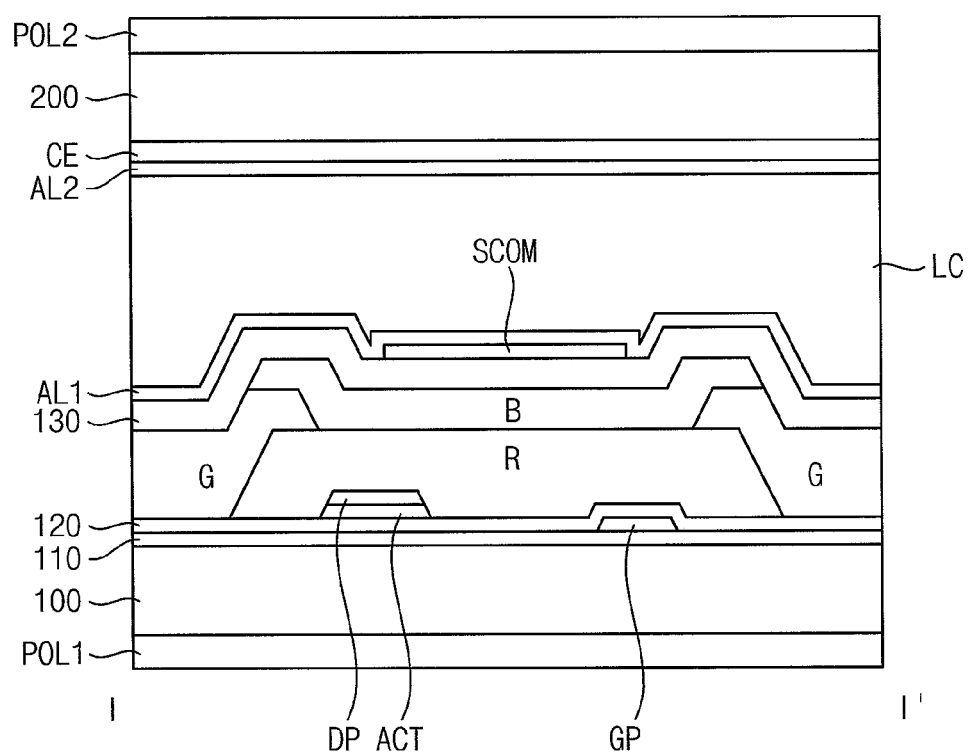
FIGS. 13A, and 13B are cross-sectional views taken along line I-I' and II-II' of the display apparatus of FIG. 12, respectively.
Figure 13B:
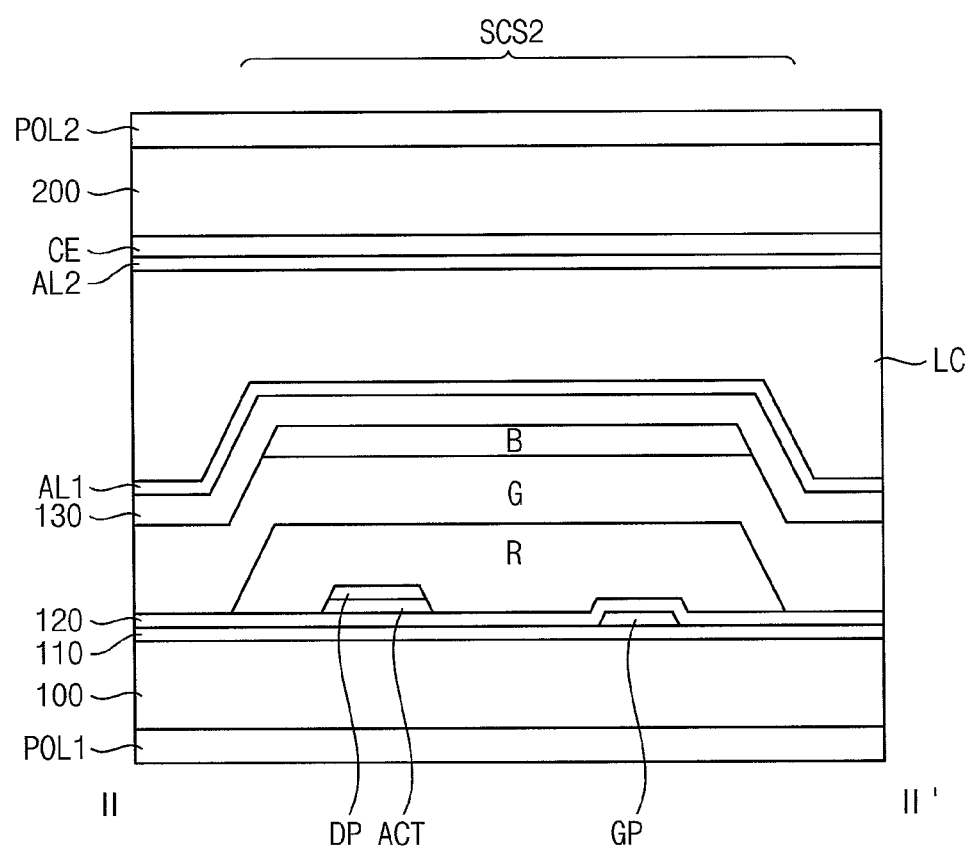

FIG. 12 is a plan view briefly illustrating pixel areas of a display apparatus according to an example embodiment of the inventive concept. FIGS. 13A, and 13B are cross-sectional views taken along line I-I' and II-II' of the display apparatus of FIG. 12, respectively.

Referring to FIGS. 12, 13A and 13B, the display apparatus may be substantially same as the display apparatus of FIG. 2, except that a bridge portion GBR is omitted in some areas and a shielding electrode SCOM is broken at the portion where the bridge portion BGR is formed. Therefore, repeated description is omitted.

The display apparatus may include a plurality of pixel areas. Each pixel area may form a red pixel including a red color filter R, a green pixel including a green color filter G, or a blue pixel including a blue color filter B. The red pixels, the green pixels, and the blue pixels may extend in a first direction D1 and may be arranged in a strip shape. The display apparatus may include a data pattern DP and a gate pattern GP.

There is a portion where the bridge portion GBR is formed and a portion where the bridge portion GBR is not formed in the light blocking area BM between neighboring green pixels. Accordingly, the green color filter G may be connected to each other within several pixel areas. The portions where the bridge portion GBR is not formed may be arranged at regular intervals or may be randomly arranged.

The shielding electrode SCOM extending in a second direction D2 may be broken at a portion where the bridge portion GBR is formed, for example a portion between a second pixel area PX2 and a third pixel area PX3. Accordingly, the bridge portion GBR may not overlap the shielding electrode SCOM.

A portion where the bridge portion GBR is formed may perform a function as a second sub-column spacer SCS2. When the bridge portion GBR overlaps the shielding electrode SCOM, the shielding electrode SCOM may be damaged by pressing of the display apparatus. According to the present embodiment, the shielding electrode SCOM is not overlap the bridge portion GBR, so that damage of the shielding electrode SCOM can be reduced although the display apparatus is pressed.

Figure 14:
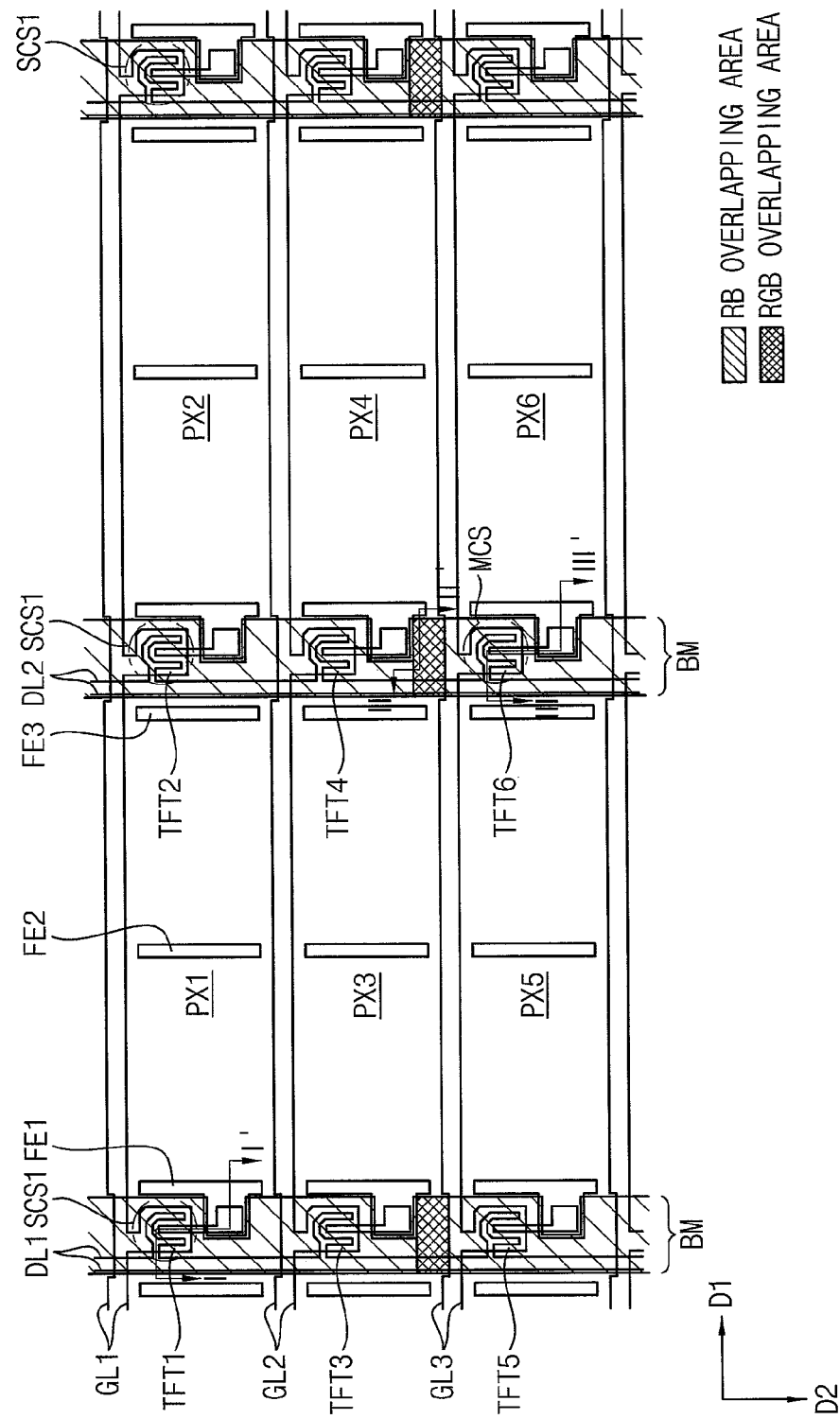
FIG. 14 is a plan view illustrating first to sixth pixel areas of a display apparatus according to an example embodiment of the inventive concept.
Figure 15A:
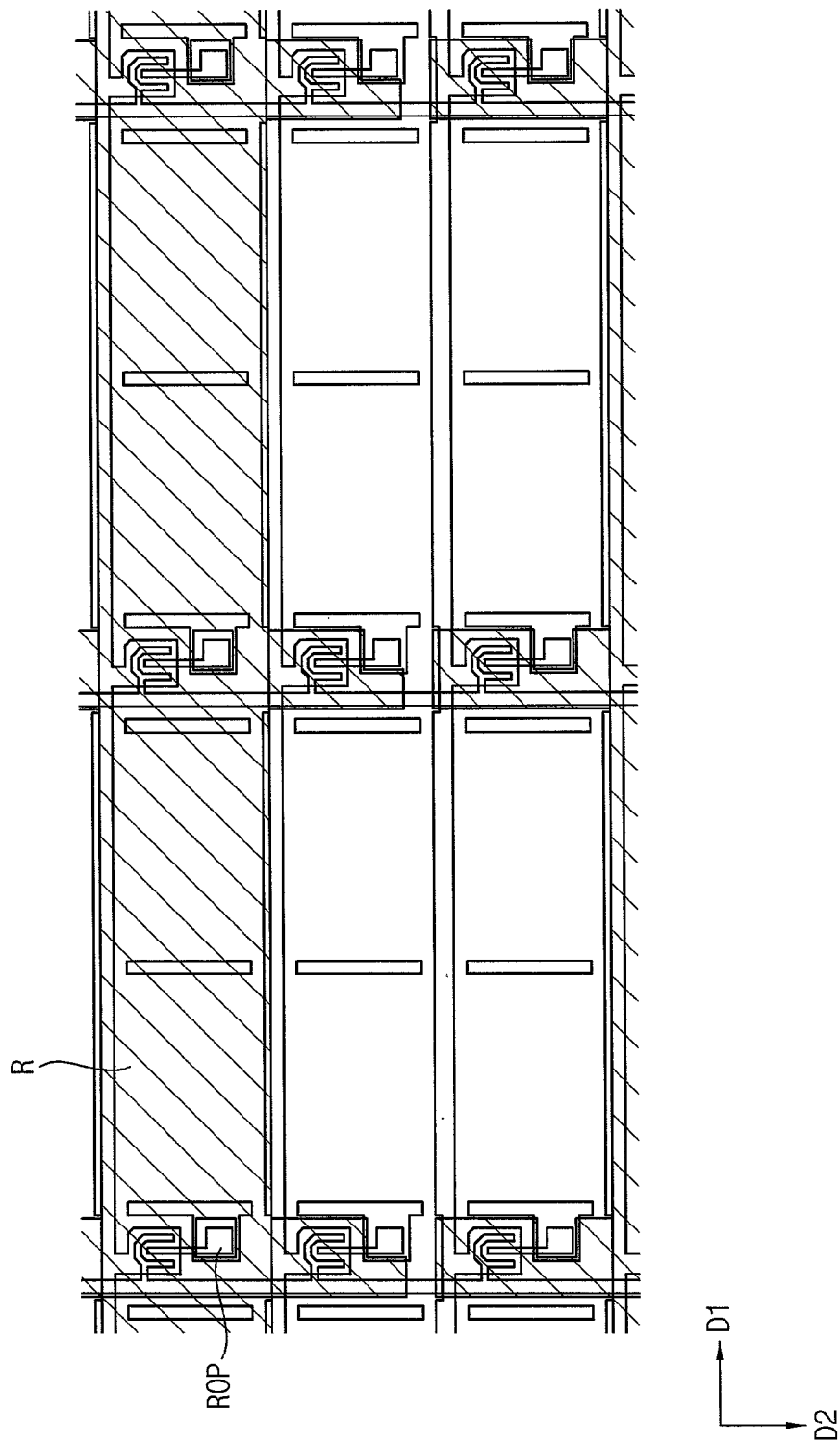
FIGS. 15A, 15B and 15C are plan views illustrating a first color filter, a second color filter, and a third color filter of the display apparatus of FIG. 14, respectively.
Figure 15B:
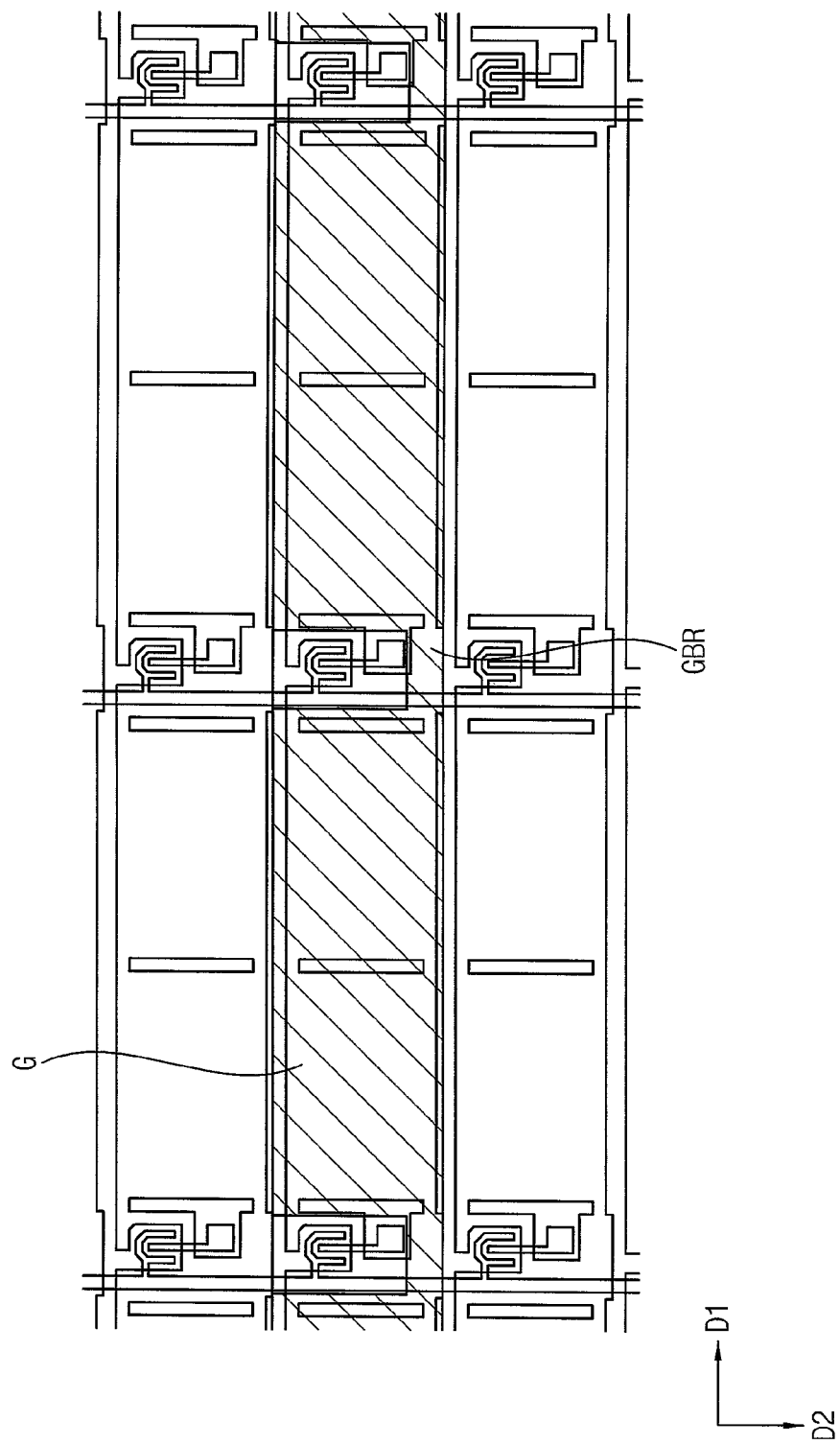
Figure 15C:
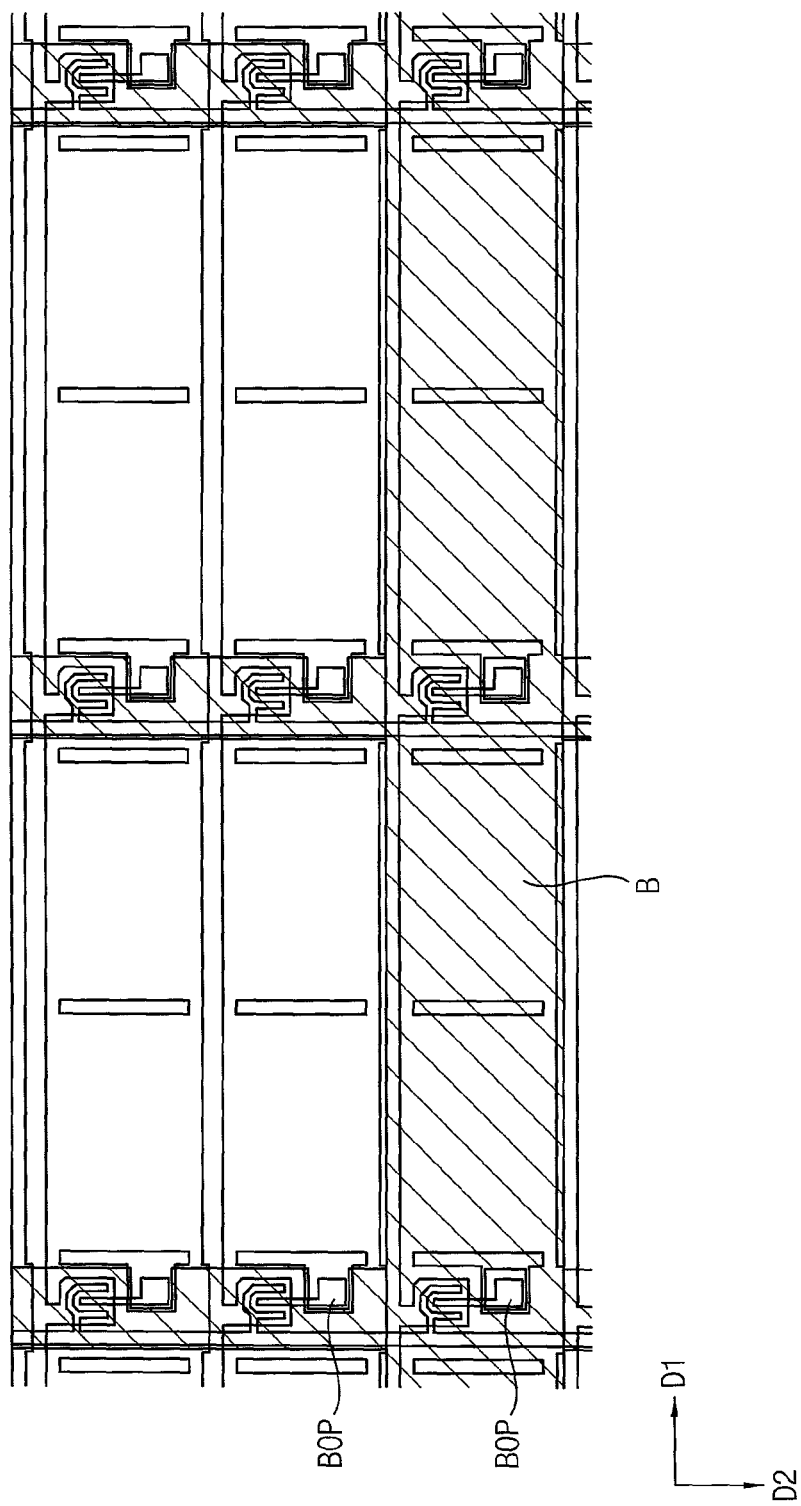
Figure 16A:
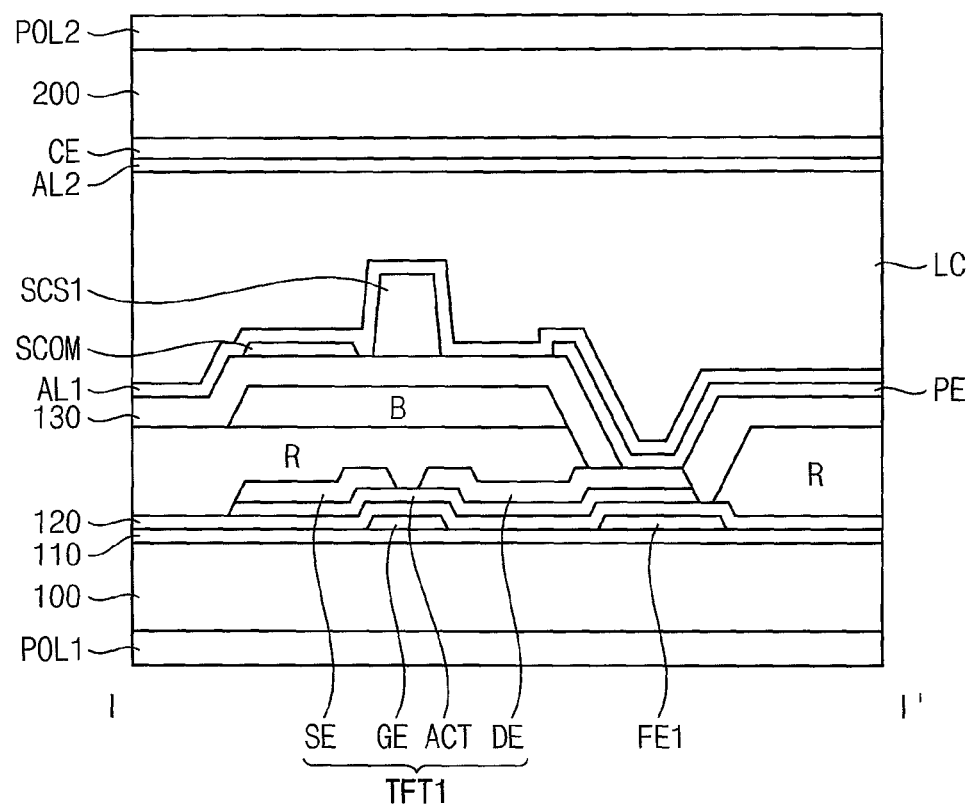
FIGS. 16A, 16B and 16C are cross-sectional views taken along line I-I', II-II' and III-III' of the display apparatus of FIG. 14, respectively.
Figure 16B:
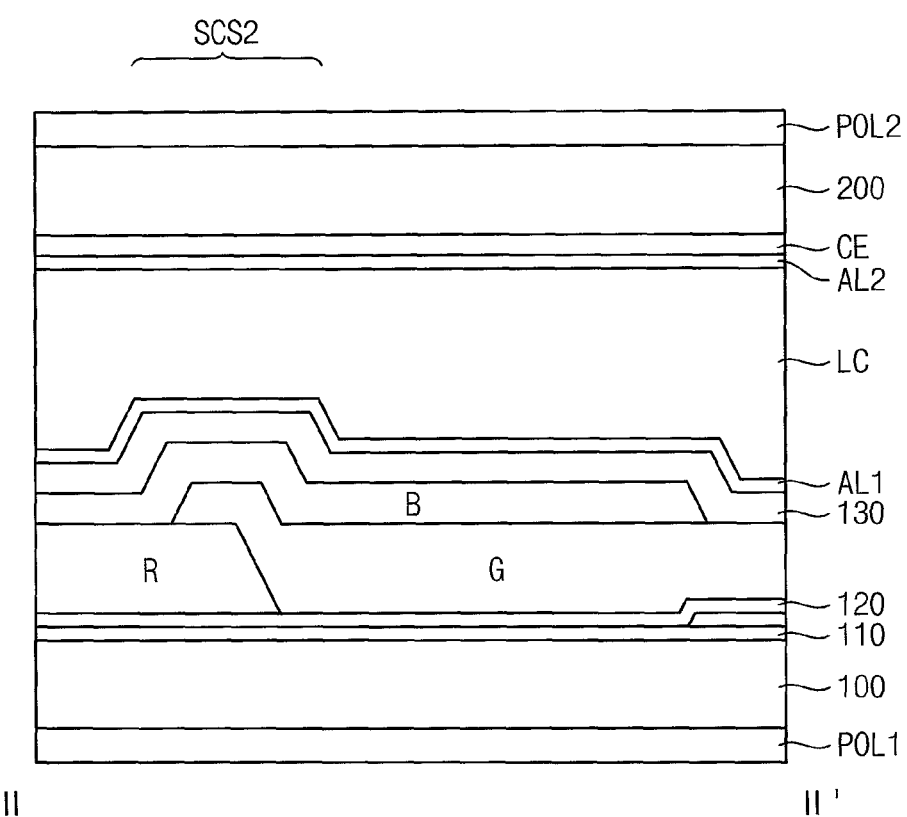
Figure 16C:
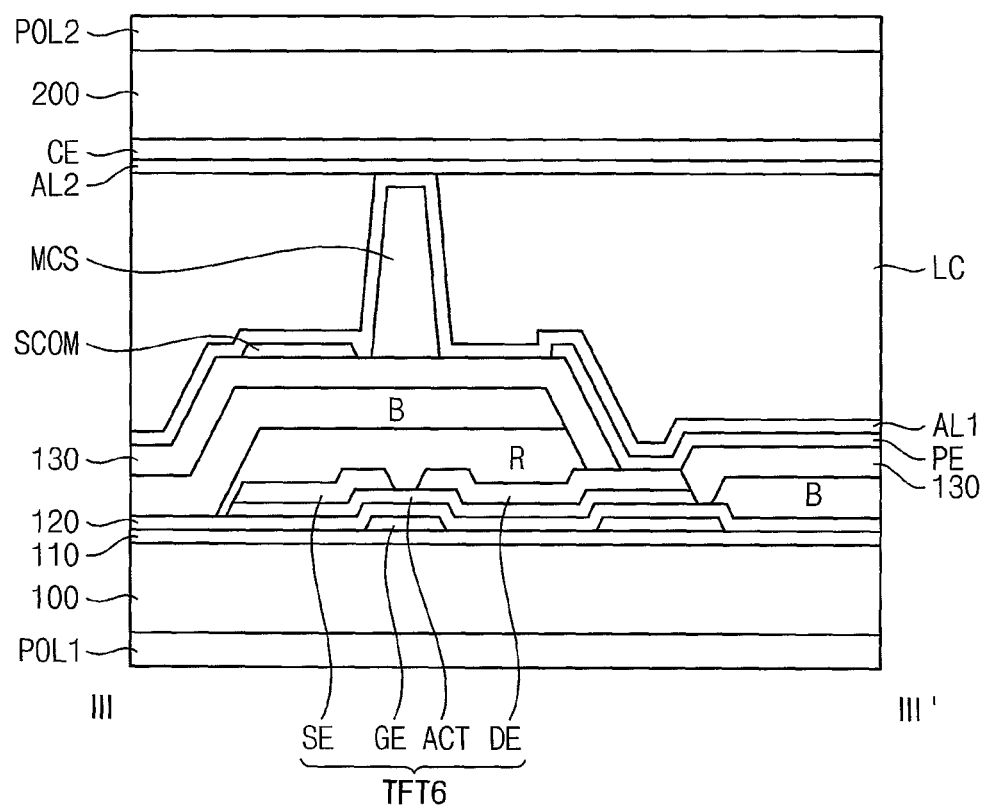

FIG. 14 is a plan view illustrating first to sixth pixel areas PX1 to PX6 of a display apparatus according to an example embodiment of the inventive concept. FIGS. 15A, 15B and 15C are plan views illustrating a first color filter R, a second color filter G, and a third color filter B of the display apparatus of FIG. 14, respectively. FIGS. 16A, 16B and 16C are cross-sectional views taken along line I-I', II-II' and III-III' of the display apparatus of FIG. 14, respectively.

Referring to FIGS. 14, 15A, 15B, 15C, 16A, 16B, and 16C, the display apparatus may be substantially same as the display apparatus of FIG. 2, except for a shape of a first color filter R. Therefore, repeated description is omitted.

The first color filter R may provide color to light transmitted through a liquid crystal layer LC. The first color filter R may be a red color filter. The first color filter R may be disposed in the first pixel area PX1, the second pixel area PX2, and the light blocking area BM. More specifically, referring again to FIG. 15A, the first color filter R may be formed in a portion of the light blocking area BM adjacent to the first pixel area PX1 where a first thin film transistor TFT1 is disposed, the first pixel area PX1, a portion of the light blocking area BM between the first pixel area PX1 and the second pixel area PX2, and the second pixel area PX2, along the first direction D1. The first color filter R may be formed in the portion of the light blocking area BM where the first thin film transistor TFT1 is disposed, a portion of the light blocking area BM where a third thin film transistor TFT3 is disposed, and a portion of the light blocking area BM where a fifth thin film transistor TFT5 is disposed, along a second direction D2.

Here, the first color filter R is not formed at a portion where a bridge portion GBR is formed. Accordingly, the first color filter R formed along the light blocking area BM. Accordingly, the bridge portion GBR may be partially overlapped or not overlapped with the first color filter R, instead of being overlapped with entire of the first color filter R.

The first color filter R may be formed in a strip shape along the first direction D1 across a plurality of pixel areas. The first color filter R may be formed in a light blocking area BM corresponding to a plurality of pixel areas in the second direction D2, and may be broken at a portion where the bridge portion GBR is formed.

In addition, an opening ROP where the first color filter R is not formed may be formed corresponding to a contact hole for the pixel electrode corresponding to each of the pixel areas.

Accordingly, a height of the second sub-column spacer SCS2 may be lower than the second sub-column spacer of the display apparatus of FIG. 2. If necessary, a cut length of the first color filter R may be adjusted to adjust an overlapping area of the first color filter R and the bridge portion GBR, so that overall height of the second sub-column spacer SCS2 can be adjusted.

According to the present example embodiment, the first color filter R, the second color filter G and the third color filter B, which determine the height of the second sub-column spacer SCS2, are formed by a full-tone exposure process without a half-tone exposure process, so that the height deviation problem of a sub-column spacer formed by the half-tone exposure process can be solved.

Figure 17:
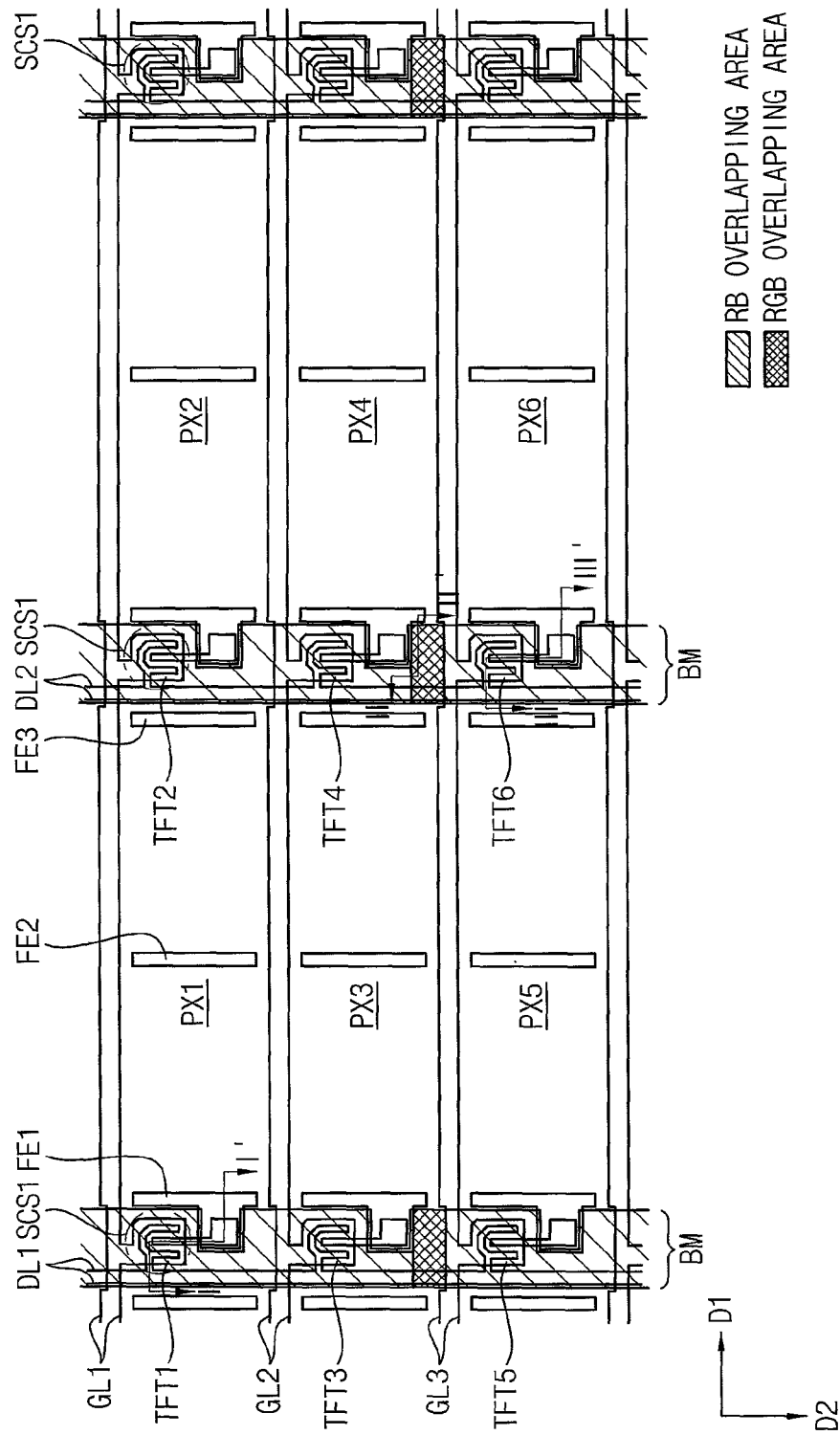
FIG. 17 is a plan view illustrating first to sixth pixel areas of a display apparatus according to an example embodiment of the inventive concept.
Figure 18A:
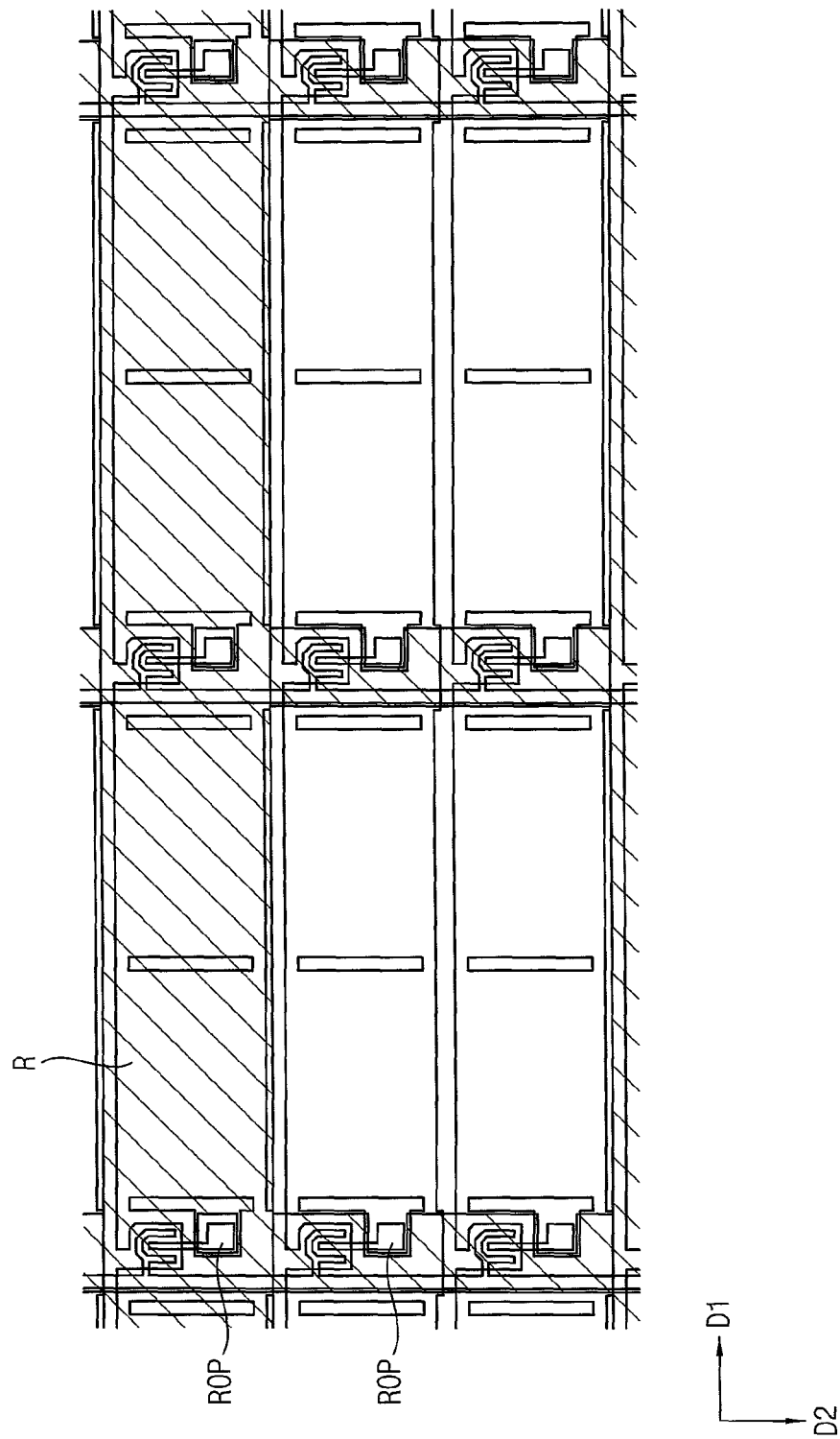
FIGS. 18A, 18B and 18C are plan views illustrating a first color filter, a second color filter, and a third color filter of the display apparatus of FIG. 17, respectively.
Figure 18B:
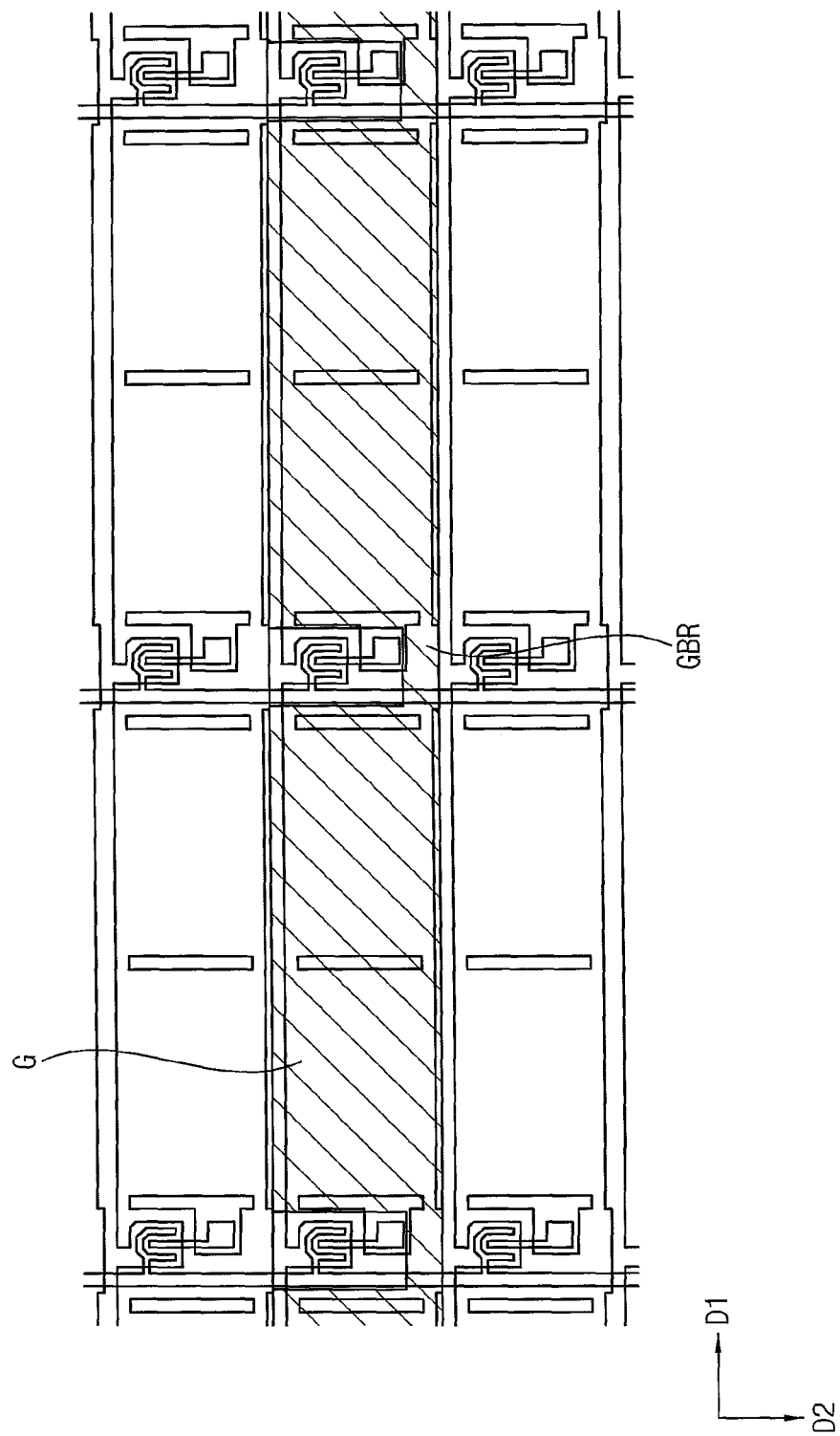
Figure 18C:
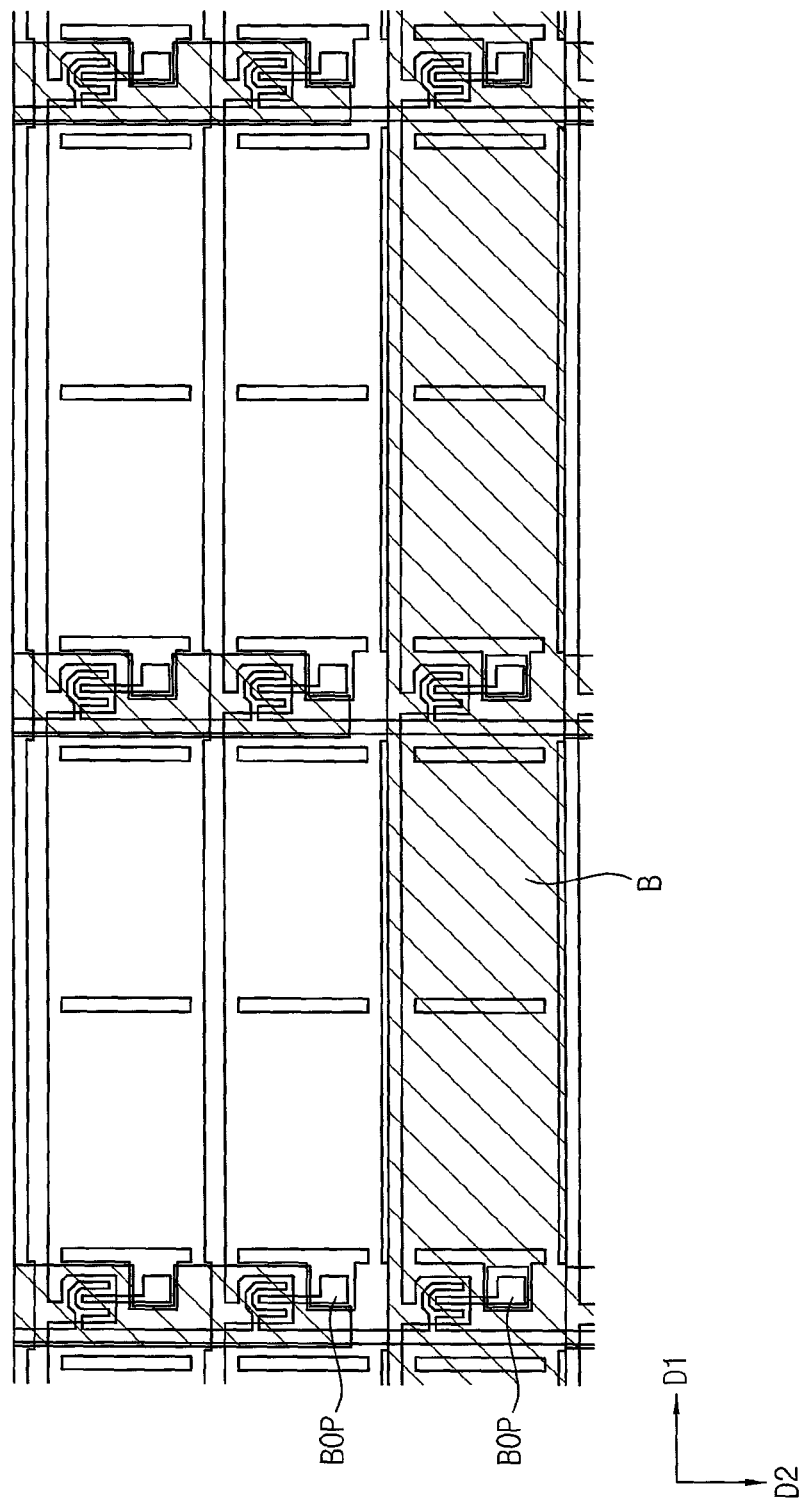
Figure 19A:
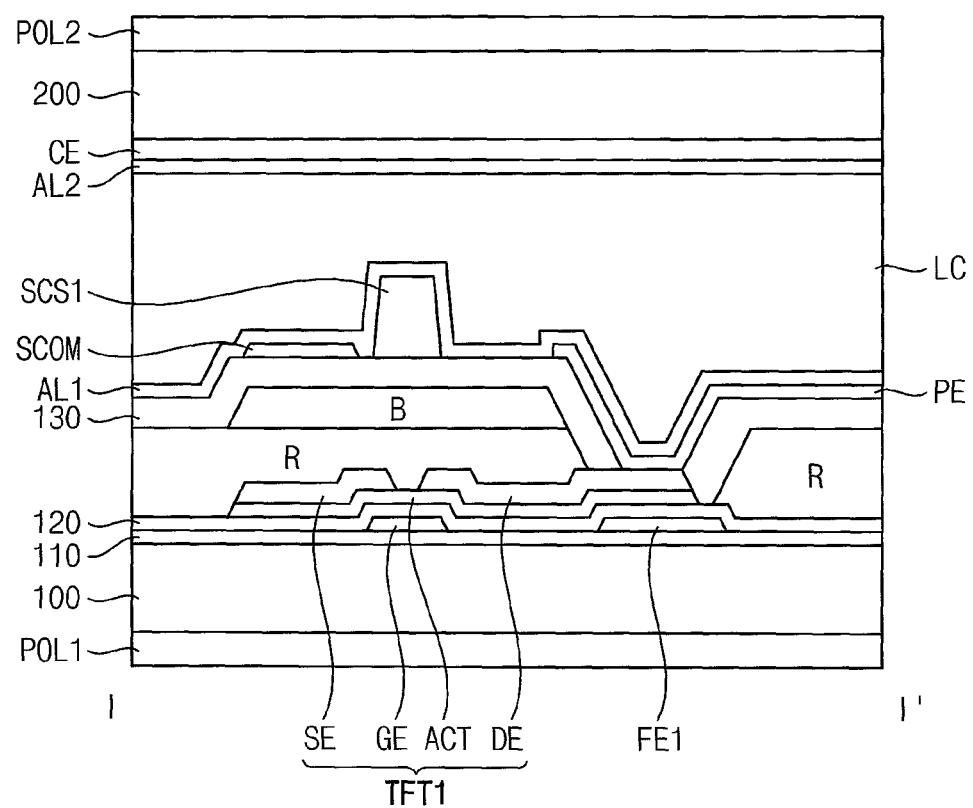
FIGS. 19A, 19B and 19C are cross-sectional views taken along line I-I', II-II' and III-III' of the display apparatus of FIG. 17, respectively.
Figure 19B:
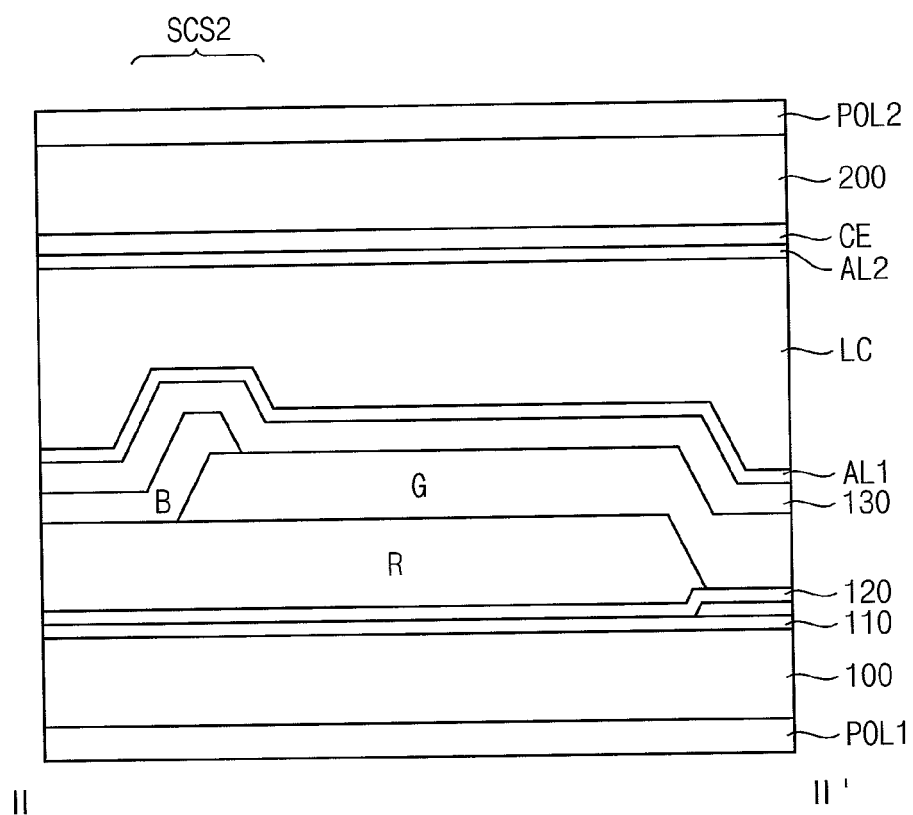
Figure 19C:
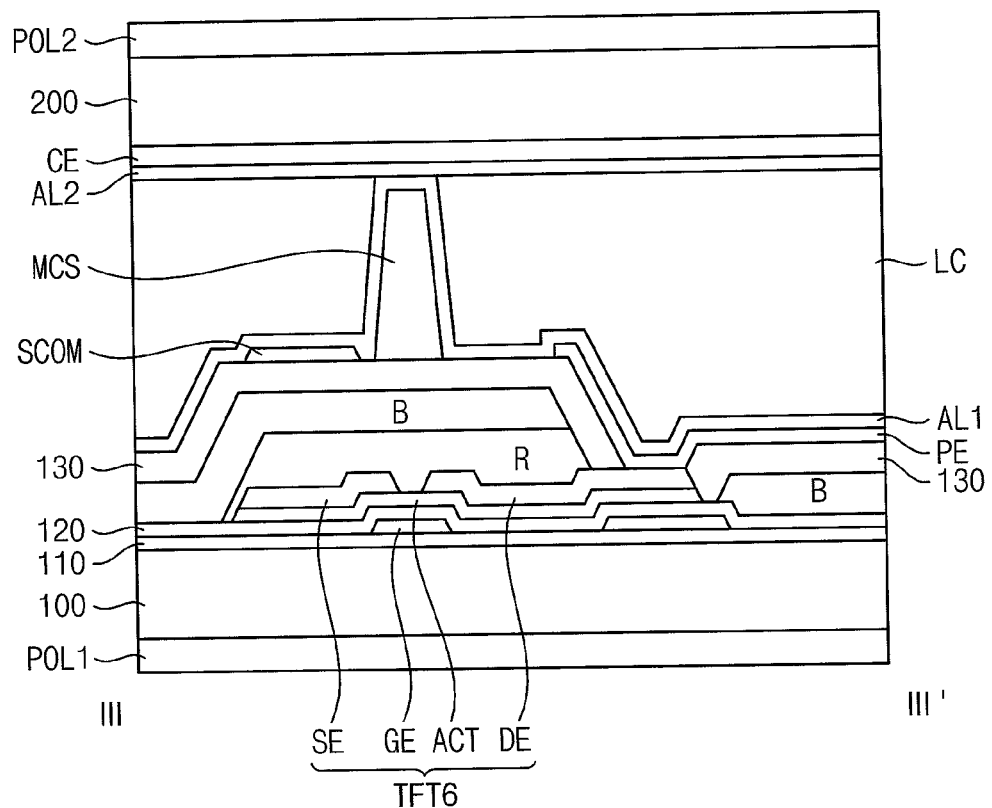

FIG. 17 is a plan view illustrating first to sixth pixel areas PX1 to PX6 of a display apparatus according to an example embodiment of the inventive concept. FIGS. 18A, 18B and 18C are plan views illustrating a first color filter R, a second color filter G, and a third color filter B of the display apparatus of FIG. 17, respectively. FIGS. 19A, 19B and 19C are cross-sectional views taken along line I-I', II-II' and III-III' of the display apparatus of FIG. 17, respectively.

Referring to FIGS. 17, 18A, 18B, 18C, 19A, 19B, and 19C, the display apparatus may be substantially same as the display apparatus of FIG. 2, except for a shape of a third color filter B. Therefore, repeated description is omitted.

The third color filter B may be disposed in a fifth pixel area PX5, a sixth pixel area PX6 and a light blocking area BM. More specifically, referring again to FIG. 18C, the third color filter B may be formed in a portion of the light blocking area BM adjacent to the fifth pixel area PX5 where a fifth thin film transistor TFT5 is disposed, the fifth pixel area PX5, a portion of the light blocking area BM between the fifth pixel area PX5 and the sixth pixel area PX6, and the sixth pixel area PX6 along the first direction D1. In addition, the third color filter B may be formed in the portion of the light blocking area BM where a first thin film transistor TFT1 is disposed, a portion of the light blocking area BM where a third thin film transistor TFT3 is disposed, and a portion of the light blocking area BM where the fifth thin film transistor TFT5 is disposed, along the second direction D2.

Here, the third color filter B is not formed where a bridge portion GBR is formed, so that the third color filter B extending the light blocking area BM is cut at the bridge portion GBR. Therefore, the bridge portion GBR may be partially overlapped or not overlapped with the third color filter B, instead of being overlapped with the entirety of the third color filter B.

Thus, the third color filter B be formed in a strip shape along a plurality of pixel areas in the first direction D1, may be formed in the light blocking area BM corresponding to a plurality of pixel areas in the second direction D2, and may have a cut portion at the bridge portion GBR.

In addition, an opening BOP where the third color filter B is not formed may be formed corresponding to a contact hole for the pixel electrode corresponding to each of the pixel areas.

Accordingly, a height of a second sub-column spacer SCS2 may be lower than the second sub-column spacer of the display apparatus of FIG. 2. If necessary, a cut length of the third color filter B may be adjusted to adjust an overlapping area of the third color filter B and the bridge portion GBR, so that overall height of the second sub-column spacer SCS2 can be adjusted.

FIGS. 20A, 20B, 20C, 20D, 20E, 20F, 20G and 20H are a method of manufacturing the display apparatus of FIG. 2.

Figure 20A:
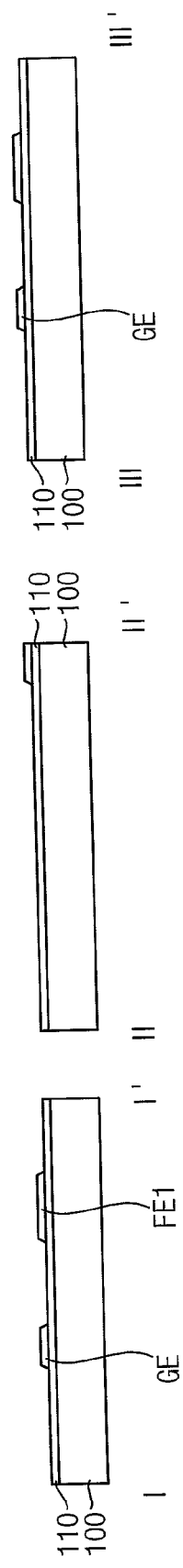
FIGS. 20A, 20B, 20C, 20D, 20E, 20F, 20G and 20H are a method of manufacturing the display apparatus of FIG. 2.

Referring to FIG. 20A, a buffer layer 110 may be formed on a first base substrate 100. The buffer layer 110 may be formed by a spin coating process, a chemical vapor deposition (CVD) process, a plasma enhanced chemical vapor deposition (PECVD) process, a high density plasma-chemical vapor deposition (HDP-CVD) process, a printing process, etc.

A gate pattern may be formed on the buffer layer 110. The gate pattern may include a plurality of gate lines, first to third floating electrodes and gate electrodes. A conductive layer (not shown) may be formed on the buffer layer 110 and then the conductive layer may be patterned by a photolithography process or an etching process using an additional etching mask. Hence, the gate pattern may be provided on the buffer layer 110. Here, the conductive layer may be formed by a printing process, a sputtering process, a CVD process, a pulsed laser deposition (PLD) process, a vacuum evaporation process, an atomic layer deposition (ALD) process, etc.

Figure 20B:
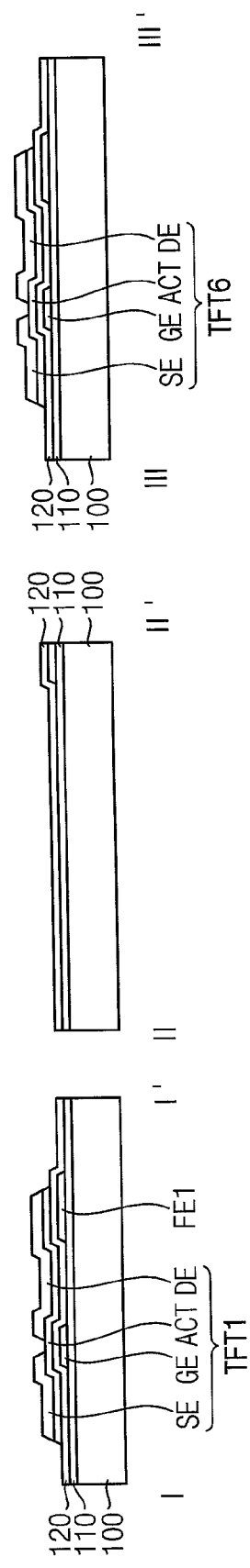

Referring to FIG. 20B, a first insulation layer 120 may be formed on the buffer layer 110 on which the gate pattern is formed. The first insulation layer 120 may be formed by a spin coating process, a CVD process, a PECVD process, a HDP-CVD process, a printing process, etc.

An active pattern ACT and a data pattern may be formed on the first insulation layer 120. The data pattern may include a plurality of data lines, source electrodes, and drain electrodes. An active layer (not shown) may be formed on the first insulation layer 120, and then a conductive layer may be formed on the active layer. Then, the conductive layer and the active layer may be simultaneously patterned to form the active pattern and the data pattern.

Figure 20C:
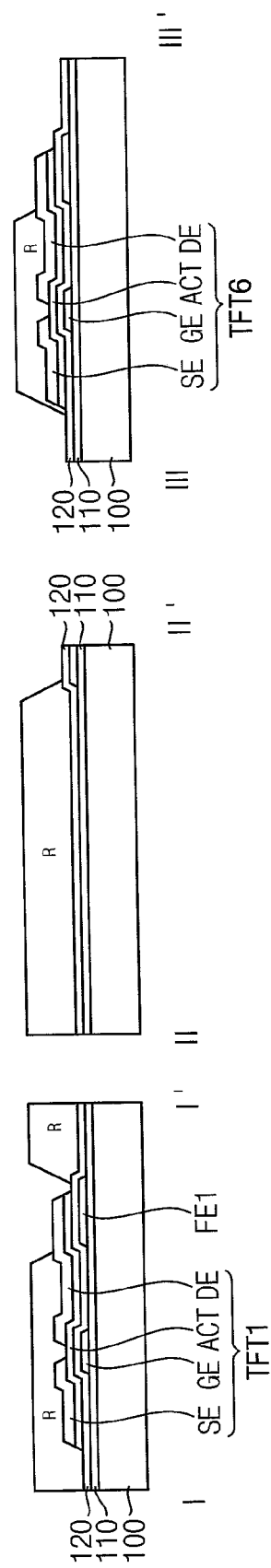

Referring to FIG. 20C, a first color filter R may be formed on the first insulation layer 120 on which the data pattern is formed. A photosensitive resist may be coated on the first insulating layer 120, and then the first color filter R may be formed by patterning the photosensitive resist through exposure and development using a mask. In addition, the first color filter R can also be formed by other methods such as an ink jet method.

Figure 20D:
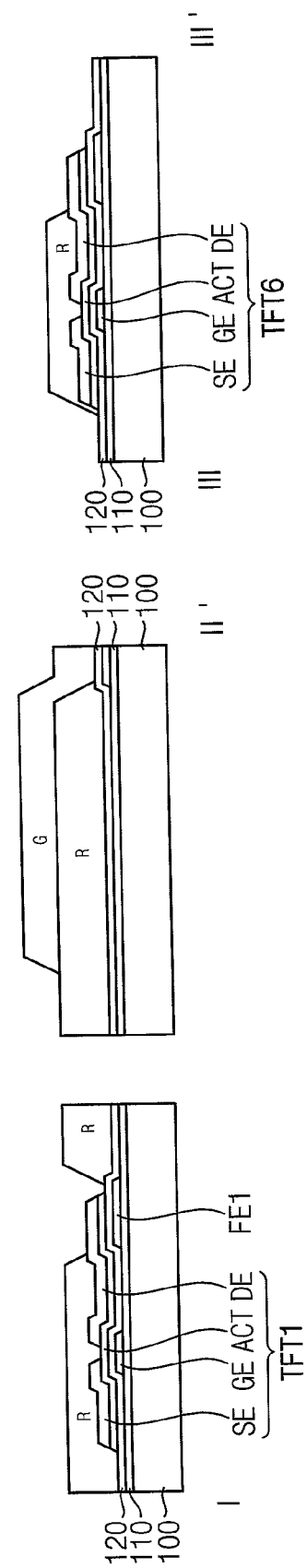

Referring to FIG. 20D, a second color filter G may be formed on the first color filter R and the first insulation layer 120. A photosensitive resist may be coated on the first color filter R and the first insulating layer 120, and then the second color filter G may be formed by patterning the photosensitive resist through exposure and development using a mask. Here, the mask may be a full tone mask including a transmissive portion and a light blocking portion. In addition, the second color filter G can also be formed by other methods such as an ink jet method.

Figure 20E:
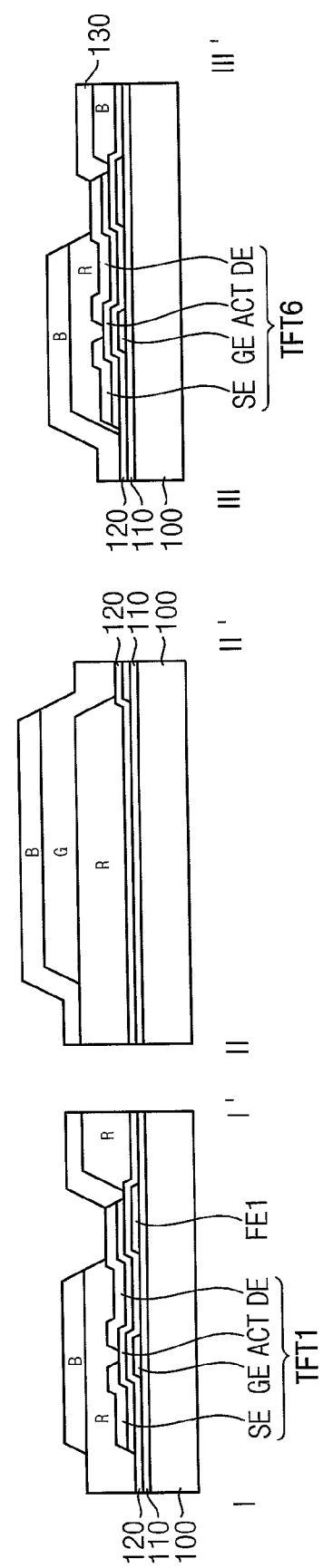

Referring to FIG. 20E, a third color filter B may be formed on the first color filter R, the second color filter G and the first insulation layer 120. A photosensitive resist may be coated on the first color filter R, the second color filter G and the first insulating layer 120, and then the third color filter B may be formed by patterning the photosensitive resist through exposure and development using a mask. Here, the mask may be a full tone mask including a transmissive portion and a light blocking portion. In addition, the third color filter B can also be formed by other methods such as an ink jet method.

Figure 20F:
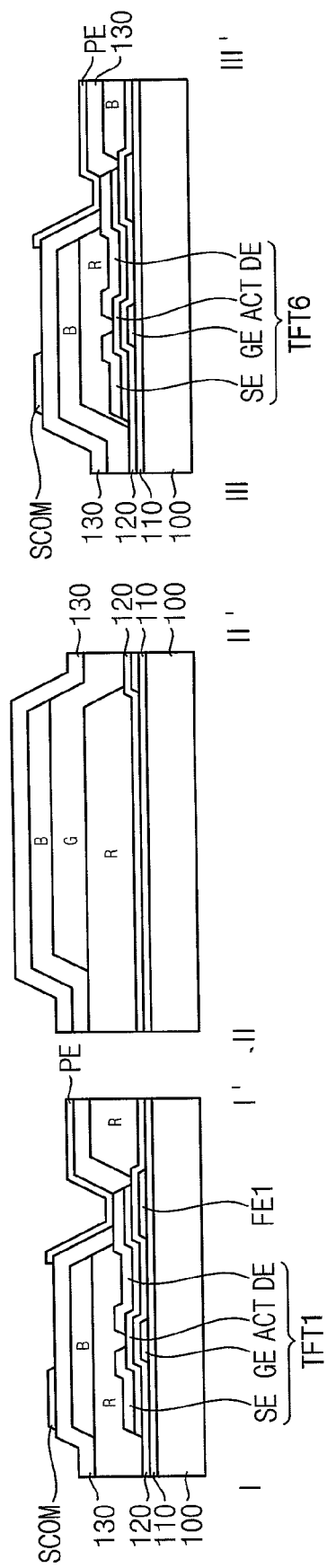

Referring to FIG. 20F, an organic insulation layer 130 may be formed on the first to third color filters R, G, and B. The organic insulation layer 130 may be obtained by a spin coating process, a printing process, a sputtering process, a CVD process, an ALD process, a PECVD process, an HDP-CVD process or a vacuum evaporation process in accordance with ingredients included in the organic insulation layer 130. After forming the organic insulation layer 130, the organic insulation layer 130 may be patterned to form a contact hole (see CNT in FIG. 4) for a pixel electrode PE through the organic insulation layer 130.

A transparent electrode pattern including the pixel electrode PE and a shielding electrode SCOM may be formed on the organic insulation layer 130. A transparent conductive layer may be formed on the organic insulation layer 130 to fill the contact hole. After that, the transparent electrode pattern may be obtained by patterning the transparent conductive layer. The transparent conductive layer may be formed by a sputtering process, a CVD process, a PLD cess, a vacuum evaporation process, an ALD process, a printing process, etc.

Figure 20G:
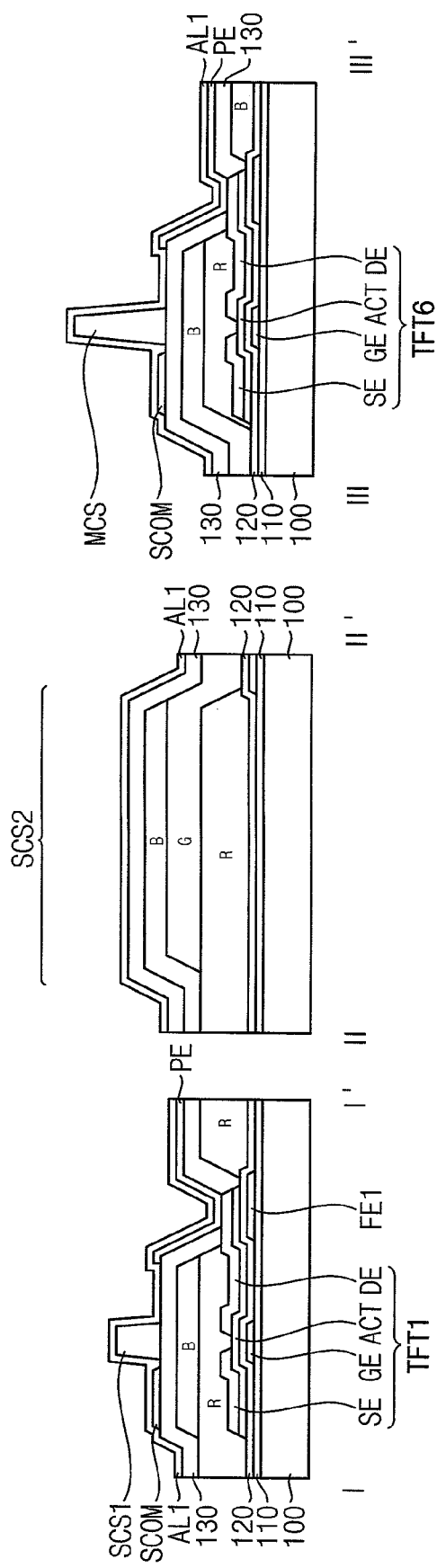

Referring to FIG. 20G, a main column spacer MCS and a first sub-column spacer SCS1 may be formed on the organic insulation layer 130 on which the transparent electrode pattern is formed. A photoresist material may be coated on the transparent electrode pattern and the organic insulation layer 130, and then the main column spacer MCS and the first sub-column spacer SCS1 may be obtained by exposure and development processes using a half-tone mask. The half-tone mask may include a light blocking area, a full-tone area and a half-tone area. Light may fully pass in the full-tone area, and partially pass in the half-tone area. The main column spacer MSC may be formed corresponding to the full-tone area, and the first sub-column spacer SCS1 may be formed corresponding to the half-tone area.

A first alignment layer AL1 may be formed on the organic insulation layer 130 on which the main column spacer MCS and the first sub-column spacer SCS1 are formed. The first alignment layer AL1 may be formed by applying an alignment agent onto the organic insulation layer 130, and then by an optical process such as rubbing or an optical process such as light irradiation or a chemical process.

Figure 20H:
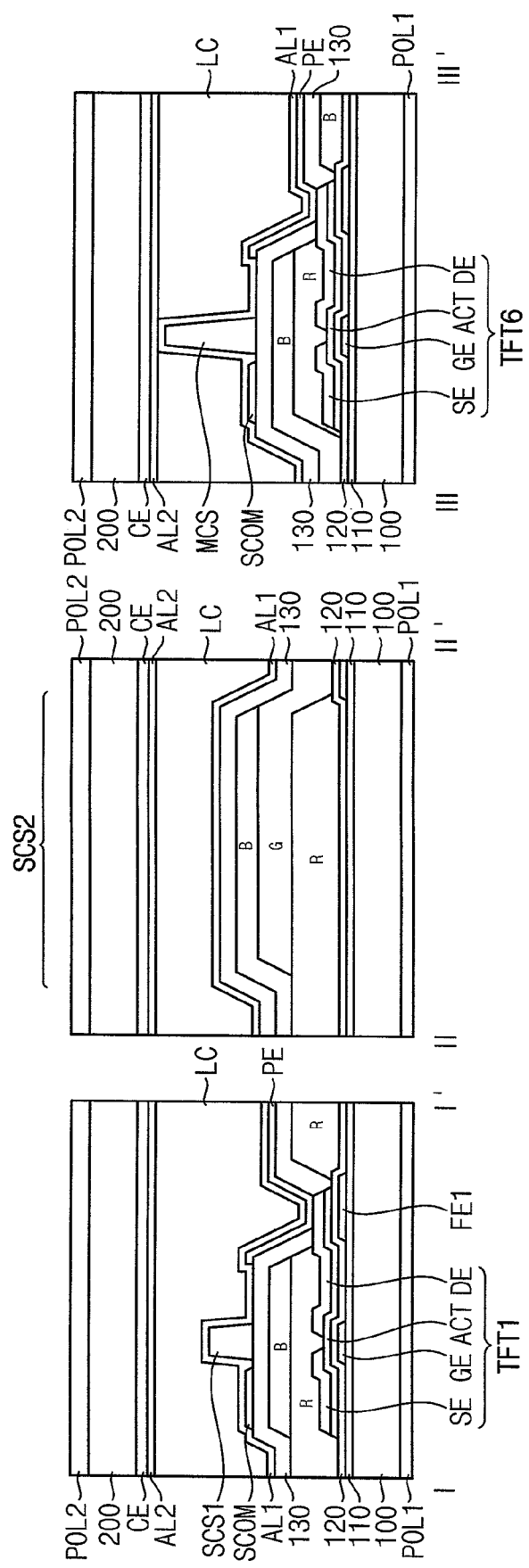

Referring to FIG. 20H, a common electrode CE may be formed on a second base substrate 200. The common electrode CE may be formed by forming a transparent conductive layer on the second base substrate 200. The transparent conductive layer may be formed by a sputtering process, a CVD process, a PLD process, vacuum evaporation process, an ALD process, a printing process, etc.

A second alignment layer AL2 may be formed on the common electrode CE. The second alignment layer AL2 may be formed by applying an alignment agent onto the common electrode CE and then by an optical process such as rubbing or an optical process such as light irradiation or a chemical process.

A liquid crystal layer LC may be formed on the first alignment layer AL1 and the second alignment layer AL2. A first polarizing plate POL1 and a second polarizing plate POL2 may be attached to the first base substrate 100 and the second base substrate 200, respectively. Accordingly, the display apparatus may be manufactured.

A manufacturing method of the display apparatus of FIG. 6 may be substantially the same as the manufacturing method of the display apparatus of FIGS. 20A to 20H except that the second color filter is formed using a halftone mask. A manufacturing method of the display apparatus of FIG. 9 may be substantially the same as the manufacturing method of the display apparatus of FIGS. 20A to 20H except for further forming a fourth color filter. On the other hand, a manufacturing method of a display apparatus according to another embodiment can also be manufactured by a similar method.

According to the present example embodiment, the light blocking function can be improved by overlapping of the first and third color filters, the first floating electrode, the gate pattern, the data pattern and the shielding electrode in the light blocking area of the display apparatus. Further, the shielding function can be improved by the gate line and the shielding electrode of the light blocking area. Accordingly, the display apparatus can implement the light blocking area without an additional black matrix structure.

In addition, since the second sub-column spacer is formed by the bridge portion of the display apparatus, the pressing gap of the display apparatus can be effectively maintained.

The foregoing is illustrative of the inventive concept and is not to be construed as limiting thereof. Although a few example embodiments of the inventive concept have been described, those skilled in the art will readily appreciate that many modifications are possible in the example embodiments without materially departing from the novel teachings and features of the inventive concept. Accordingly, all such modifications are intended to be included within the scope of the inventive concept as defined in the claims. In the claims, any means-plus-function clauses are intended to cover the structures described herein as performing the recited function and not only structural equivalents but also equivalent structures. Therefore, it is to be understood that the foregoing is illustrative of the inventive concept and is not to be construed as limited to the specific example embodiments disclosed, and that modifications to the disclosed example embodiments, as well as other example embodiments, are intended to be included within the scope of the appended claims. The inventive concept is defined by the following claims, with equivalents of the claims to be included therein.

What is claimed is:

1. A display apparatus comprising a plurality of pixel areas and a light blocking area between the pixel areas, comprising:
   a first base substrate;
   a thin film transistor disposed on the first base substrate corresponding to each of the pixel areas;
   a first color filter having a first color and disposed on the first base substrate;

a second color filter having a second color different from the first color, and disposed on the first base substrate; and a third color filter having a third color different from the first and second colors, and disposed on the first base substrate, wherein in the light blocking area, the thin film transistor, the first color filter, and the third color filter at least partially overlap each other, and the second color filter in at least one pixel area is connected to an adjacent second color filter disposed in an adjacent pixel area by a bridge portion, and the bridge portion is formed of the same material as the second color filter and is disposed in the light blocking area.

2. The display apparatus of claim 1, wherein the first color is red, the second color is green, and the third color is blue.

3. The display apparatus of claim 2, wherein the first color filter extends in a first direction across a plurality of pixel areas, the second color filter extends in the first direction across a plurality of pixel areas, the third color filter extends in the first direction across a plurality of pixel areas, so that each of the first, second, and third color filters is arranged in a strip shape.

4. The display apparatus of claim 1, wherein the bridge portion does not overlap with the thin film transistor.

5. The display apparatus of claim 1, further comprising:
a fourth color filter disposed on the first base substrate, the fourth color filter being transparent,
wherein the first, second, and third color filters overlap with the fourth color filter.

6. The display apparatus of claim 1, further comprising:
an organic insulation layer disposed on the first, second, and third color filters, and comprising an organic insulation material.

7. The display apparatus of claim 6, further comprising:
a shielding electrode disposed on the organic insulation layer in the light blocking area.

8. The display apparatus of claim 7, further comprising:
a pixel electrode electrically connected to the thin film transistor and formed from a same layer as the shielding electrode, and
wherein the pixel electrode is electrically connected through a contact hole extending through the first color filter, the third color filter, and the organic insulation layer.

9. The display apparatus of claim 8, further comprising:
a floating electrode disposed on the first base substrate, and
wherein the pixel electrode comprises a stem extending in a first direction or a third direction, and a plurality of slits extending from the stem to an edge of the pixel electrode.

10. The display apparatus of claim 1, further comprising:
a second base substrate facing the first base substrate;
a liquid crystal layer between the first base substrate and the second base substrate; and
a main column spacer overlapping the first, second, and third color filters, and
wherein the main column spacer is for maintaining a cell gap of the liquid crystal layer.

11. The display apparatus of claim 10, wherein the bridge portion of the second color filter overlaps the first color filter, the third color filter, or the first and third color filters,
a second sub-column spacer which is smaller than the main column spacer is formed by the bridge portion for maintaining a pressing gap of the liquid crystal layer.

12. The display apparatus of claim 11, further comprising a first sub-column spacer which is smaller than the main column spacer for maintaining the pressing gap.

13. The display apparatus of claim 1, further comprising a shielding electrode disposed in the light blocking area and comprising a transparent conductive material, and
wherein the shielding electrode is a mesh structure along the light blocking area, the second color filter is cut off at a portion where the bridge portion is disposed, so that the bridge portion does not overlap with the shielding electrode.

14. The display apparatus of claim 1, wherein the first color is red, and the first color filter is cut off at a portion where the bridge portion is disposed, and
the bridge portion entirely overlaps with the third color filter in the light blocking area, and the bridge portion does not entirely overlap with the first color filter.

15. The display apparatus of claim 1, wherein the third color is blue, the third color filter is cut off at a portion where the bridge portion is disposed, and
the bridge portion entirely overlaps with the first color filter in the light blocking area, and the bridge portion does not entirely overlap with the third color filter.

16. A display apparatus comprising a plurality of pixel areas and a light blocking area between the pixel areas, comprising:
a first base substrate;
a thin film transistor disposed on the first base substrate corresponding to each of the pixel areas;
a first color filter having a first color and disposed on the first base substrate;
a second color filter having a second color different from the first color, and disposed on the first base substrate; and
a third color filter having a third color different from the first and second colors, and disposed on the first base substrate,
wherein in the light blocking area, the thin film transistor, the first color filter, and the third color filter at least partially overlap each other, and
the second color filter is connected to an adjacent second color filter by a bridge portion, and the bridge portion and the second color filter comprise the same material.

* * * * *